US012652940B2

(12) United States Patent
Son et al.

(10) Patent No.: US 12,652,940 B2
(45) Date of Patent: Jun. 9, 2026

(54) DISPLAY PANEL AND DISPLAY DEVICE INCLUDING REFLECTIVE ADJUSTMENT LAYER HAVING PROTRUSIONS

(71) Applicant: Samsung Display Co., LTD., Yongin-si (KR)

(72) Inventors: Jong Ho Son, Yongin-si (KR); Dae Won Kim, Yongin-si (KR); Hye Beom Shin, Yongin-si (KR); Jin Hyeong Lee, Yongin-si (KR); Sun Young Chang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 411 days.

(21) Appl. No.: 18/133,911

(22) Filed: Apr. 12, 2023

(65) Prior Publication Data
US 2024/0074296 A1 Feb. 29, 2024

(30) Foreign Application Priority Data
Aug. 23, 2022 (KR) ........................ 10-2022-0105491

(51) Int. Cl.
*H10K 59/80* (2023.01)
*G06F 3/044* (2006.01)
(Continued)

(52) U.S. Cl.
CPC ....... *H10K 59/8792* (2023.02); *G06F 3/0446* (2019.05); *H10K 59/873* (2023.02); (Continued)

(58) Field of Classification Search
CPC ...... H10K 50/865; H10K 50/11; H10K 50/81; H10K 50/82; H10K 50/8426; (Continued)

(56) References Cited

U.S. PATENT DOCUMENTS 7,255,937 B2 8/2007 Park
8,446,346 B2 5/2013 Jeong et al.
(Continued)

FOREIGN PATENT DOCUMENTS

KR 1020050010333 A 1/2005
KR 1020110058504 A 6/2011
(Continued)

OTHER PUBLICATIONS

J.-Q. Xi, et al., "Optical thin-film materials with low refractive index for broadband elimination of Fresnel reflection", Published online: Mar. 1, 2007; doi:10.1038/nphoton.2007.26, (4 pages).
(Continued)

*Primary Examiner* — Ida M Soward
(74) *Attorney, Agent, or Firm* — CANTOR COLBURN LLP

(57) ABSTRACT
A display panel includes a first substrate including a display area, in which a plurality of pixel areas is arranged, and a non-display area around the display area, a second substrate disposed opposite to the first substrate, a light emitting array disposed on the first substrate and including a plurality of light emitting elements corresponding to the plurality of pixel areas, a sealing layer disposed in the non-display area between the first substrate and the second substrate and bonding the first substrate and the second substrate to each other, a vacuum layer sealed by the sealing layer and defined between the light emitting array and the second substrate, and a reflection adjustment layer disposed on the second substrate and absorbing a portion of external light, where the reflection adjustment layer includes a plurality of protrusions protruding toward the light emitting array and exposed to the vacuum layer.

21 Claims, 17 Drawing Sheets

(51) Int. Cl.

| | |
|---|---|
| *H10K 59/12* | (2023.01) |
| *H10K 59/40* | (2023.01) |

(52) U.S. Cl.
CPC .. *G06F 3/0445* (2019.05); *G06F 2203/04111* (2013.01); *H10K 59/12* (2023.02); *H10K 59/40* (2023.02)

(58) Field of Classification Search
CPC ............. H10K 50/844; H10K 59/8792; H10K 59/873; H10K 59/12; H10K 59/40; H10K 59/38; H10K 50/122; G06F 3/0445; G06F 3/0446
See application file for complete search history.

(56) References Cited

U.S. PATENT DOCUMENTS

| | | | | |
|---|---|---|---|---|
| 8,872,201 | B2 | 10/2014 | Kim et al. | |
| 11,068,092 | B2 | 7/2021 | Han et al. | |
| 2004/0183971 | A1* | 9/2004 | Fukuchi ............ | G02F 1/136222 |
| | | | | 349/114 |
| 2005/0001546 | A1* | 1/2005 | Yamaguchi .......... | H10K 71/166 |
| | | | | 313/506 |
| 2010/0072882 | A1* | 3/2010 | Hwang ................. | H10K 59/30 |
| | | | | 313/504 |

| | | | | |
|---|---|---|---|---|
| 2010/0244169 | A1* | 9/2010 | Maeda ................... | G02B 1/118 |
| | | | | 257/E31.127 |
| 2014/0291648 | A1* | 10/2014 | Yamazaki ............ | H10K 59/124 |
| | | | | 257/40 |
| 2014/0340911 | A1* | 11/2014 | Woo ..................... | G02B 5/0231 |
| | | | | 362/311.03 |
| 2016/0116772 | A1* | 4/2016 | Cha ..................... | G02F 1/13394 |
| | | | | 349/123 |
| 2018/0188606 | A1* | 7/2018 | Lee ................... | G02F 1/133512 |
| 2021/0126227 | A1* | 4/2021 | Choi ................... | H10K 59/879 |
| 2021/0384272 | A1* | 12/2021 | Zhang ................... | H10K 59/40 |

FOREIGN PATENT DOCUMENTS

| | | |
|---|---|---|
| KR | 101107172 | 1/2012 |
| KR | 20180029177 | 3/2018 |
| KR | 1020190079784 A | 7/2019 |
| KR | 1020200053064 A | 5/2020 |

OTHER PUBLICATIONS

Yi-An Chen, et al., "Enhancing optical transmission of multilayer composites using interfacial nanostructures", J. Appl. Phys. 126, 063101 (2019); https://doi.org/10.1063/1.5097832Submitted: Mar. 28, 2019 . Accepted: Jul. 15, 2019 . Published Online: Aug. 8, 2019, (11 pages).

\* cited by examiner (a)

(b)

(c)

(d)

DISPLAY PANEL AND DISPLAY DEVICE INCLUDING REFLECTIVE ADJUSTMENT LAYER HAVING PROTRUSIONS

This application claims priority to Korean Patent Application No. 10-2022-0105491, filed on Aug. 23, 2022, and all the benefits accruing therefrom under 35 U.S.C. § 119, the content of which in its entirety is herein incorporated by reference.

BACKGROUND

1. Field

The disclosure relates to a display panel and a display device including the display panel.

2. Description of the Related Art

As the information society develops, the demand for a display device for displaying an image is increasing in various forms. For example, the display device is applied to various electronic devices such as a smart phone, a digital camera, a notebook computer, a navigation system, and a smart television.

The display device typically includes a display panel that emits light for displaying an image, and a driving unit that supplies signals and voltages for driving the display panel.

The display panel may include a pair of substrates facing each other, and a polarizing member or a light emitting member disposed between the pair of substrates.

In addition, the display device may further include a polarizing plate disposed on a surface from which light for image display is emitted to reduce external light reflection.

Since the polarizing plate selectively transmits light polarized in a predetermined direction, external light reflected by the display panel may be blocked from being emitted to the outside.

SUMMARY

In a display device including a polarizing plate to reduce external light reflection, since not only external light but also light for image display is polarized by the polarizing plate, the transmittance of light for image display is lowered. Therefore, the light efficiency of the display device is lowered, and there is a limit in improving the luminance.

Embodiments of the disclosure provide a display panel capable of reducing external light reflection, and a method of manufacturing a display device and the display panel.

According to an embodiment, a display panel includes a first substrate including a display area, in which a plurality of pixel areas for displaying an image is arranged, and a non-display area around the display area, a second substrate disposed opposite to the first substrate, a light emitting array disposed on the first substrate, where the light emitting array includes a plurality of light emitting elements corresponding to the plurality of pixel areas, a sealing layer disposed in the non-display area between the first substrate and the second substrate, where the sealing layer bonds the first substrate and the second substrate to each other, a vacuum layer sealed by the sealing layer and defined between the light emitting array and the second substrate, and a reflection adjustment layer disposed on the second substrate, where the reflection adjustment layer absorbs a portion of external light, where the reflection adjustment layer includes a plurality of protrusions protruding toward the light emitting array and exposed to the vacuum layer.

In an embodiment, the reflection adjustment layer may have a refractive index greater than a refractive index of the vacuum layer, where the refractive index of the reflection adjustment layer corresponding to each of the plurality of protrusions may decrease as being away from the second substrate in a direction to the vacuum layer.

In an embodiment, each of the plurality of protrusions may have a moth-eye shape which is tapered toward the vacuum layer.

In an embodiment, the reflection adjustment layer may include an organic material including a dye or a pigment, the dye or the pigment may selectively absorb light in a wavelength range, which is outside a wavelength range of light emitted from the plurality of pixel areas, among external light.

In an embodiment, an absorption wavelength range of the dye or pigment may include a wavelength range of about 490 nm to about 505 nm or a wavelength range of about 585 nm to about 600 nm.

In an embodiment, the display panel may further include a reflective light absorbing layer disposed between the light emitting array and the vacuum layer, where the reflective light absorbing layer may absorb at least a portion of light reflected from the light emitting array.

In an embodiment, the reflective light absorbing layer may include at least one selected from bismuth (Bi) and ytterbium (Yb).

In an embodiment, the reflective light absorbing layer may include an inorganic material having a refractive index of about 1 or more and an absorption coefficient of about 0.5 or more.

In an embodiment, the display panel may further include a phase adjustment layer disposed between the light emitting array and the reflective light absorbing layer, where the phase adjustment layer may change a phase of light passing therethrough.

In an embodiment, the phase adjustment layer delays the phase by $\lambda/4$.

In an embodiment, the reflective light absorbing layer may absorbs at least the portion of the light reflected from the light emitting array based on a face interference between the external light, which is incident from the second substrate, and reflected light, which is incident from the second substrate, passed through the phase adjustment layer, and reflected by the light emitting array.

In an embodiment, the display panel may further include an encapsulating structure disposed on the reflective light absorbing layer.

In an embodiment, the light emitting array may include a plurality of first electrodes corresponding to the plurality of pixel areas, a pixel defining layer defining the pixel area and covering edges of each of the plurality of first electrodes, a plurality of light emitting structures respectively disposed on the plurality of first electrodes and a second electrode disposed on the pixel defining layer and the plurality of light emitting structures, where each of the plurality of light emitting elements has a structure in which a corresponding one of the plurality of light emitting structures is interposed between a corresponding one of the plurality of first electrodes and the second electrode.

According to an embodiment, a display device includes a display panel including a display area on which an image is displayed, a touch sensing unit disposed on the display panel and a protective substrate attached to the display panel through an adhesive layer covering the touch sensing unit, where the display panel includes a first substrate including the display area, in which a plurality of pixel areas is arranged, and a non-display area around the display area, a second substrate disposed opposite to the first substrate, a light emitting array disposed on the first substrate, where the light emitting array includes a plurality of light emitting elements corresponding to the plurality of pixel areas, a sealing layer disposed in the non-display area between the first substrate and the second substrate, where the sealing layer bonds the first substrate and the second substrate to each other, a vacuum layer sealed by the sealing layer and defined between the light emitting array and the second substrate, and a reflection adjustment layer disposed on the second substrate, where the reflection adjustment layer absorbs a portion of external light, where the reflection adjustment layer includes a plurality of protrusions protruding toward the light emitting array and exposed to the vacuum layer.

In an embodiment, the reflection adjustment layer may have a refractive index greater than a refractive index of the vacuum layer, where the refractive index of the reflection adjustment layer corresponding to each of the plurality of protrusions may decrease as being away from the second substrate in a direction to the vacuum layer.

In an embodiment, each of the plurality of protrusions may have a moth-eye shape which is tapered toward the vacuum layer.

In an embodiment, the reflection adjustment layer may include an organic material including a dye or a pigment, where the dye or the pigment may selectively absorb light in a wavelength range, which is outside a wavelength range of light emitted from the plurality of pixel areas, among external light, where an absorption wavelength range of the dye or pigment may include a wavelength range of about 490 nm to about 505 nm or a wavelength range of about 585 nm to about 600 nm.

In an embodiment, the display panel may further include a reflective light absorbing layer disposed between the light emitting array and the vacuum layer, where the reflective light absorbing layer may absorb at least a portion of light reflected from the light emitting array.

In an embodiment, the reflective light absorbing layer may include at least one selected from bismuth (Bi) and ytterbium (Yb).

In an embodiment, the display panel may further include a phase adjustment layer disposed between the light emitting array and the reflective light absorbing layer, where the phase adjustment layer may change a phase of light passing therethrough.

In an embodiment, the display panel may further include an encapsulating structure disposed on the reflective light absorbing layer.

In an embodiment, the touch sensing unit may be disposed on the second substrate, where the touch sensing unit may include a plurality of first touch lines extending in a first direction and a plurality of second touch lines extending in a second direction crossing the first direction, where each of the plurality of first touch lines includes a plurality of first electrode patterns arranged in the first direction, where each of the plurality of second touch lines includes a plurality of second electrode patterns disposed in a same layer as the first electrode patterns and arranged in the second direction and a connection pattern, where each of the plurality of first touch lines may further include a bridge pattern disposed in a different layer from the first electrode pattern and the second electrode pattern, intersecting the connection pattern, and connected between adjacent first electrode patterns in the first direction.

The display panel according to embodiments includes a reflection adjustment layer disposed under an encapsulation substrate and on a light emitting array and formed in a moss-eye structure. In such embodiments, the display panel includes a reflection adjustment layer that absorbs a portion of light, such that it is possible to reduce reflectance of reflected light while maintaining transmittance.

In such embodiments, since the reflection adjustment layer includes a dye or pigment that selectively absorbs light in a wavelength area outside of a wavelength range of light emitted from a plurality of pixel areas among external light incident through the encapsulation substrate, external light reflection is reduced, and optical efficiency may be improved.

In such embodiments, the external light is reflected by the light emitting array and emitted through the encapsulation substrate, that is, external light reflection may be reduced by absorbing at least a portion of the reflected light reflected from the second electrode among the incident light incident from the outside including the reflective light absorbing layer.

Therefore, since the display panel according to the embodiments may reduce external light reflection without including a polarizing plate or a filler, a decrease in light efficiency due to the polarizing plate may be effectively prevented or resonance reduction by the filler may be effectively prevented.

However, the effects of the disclosure are not limited to the aforementioned effects, and various other effects are included in the specification.

BRIEF DESCRIPTION OF THE DRAWINGS

The above and other features of embodiments of the disclosure will become more apparent by describing in detail embodiments thereof with reference to the attached drawings, in which.

DETAILED DESCRIPTION

Figure 1:
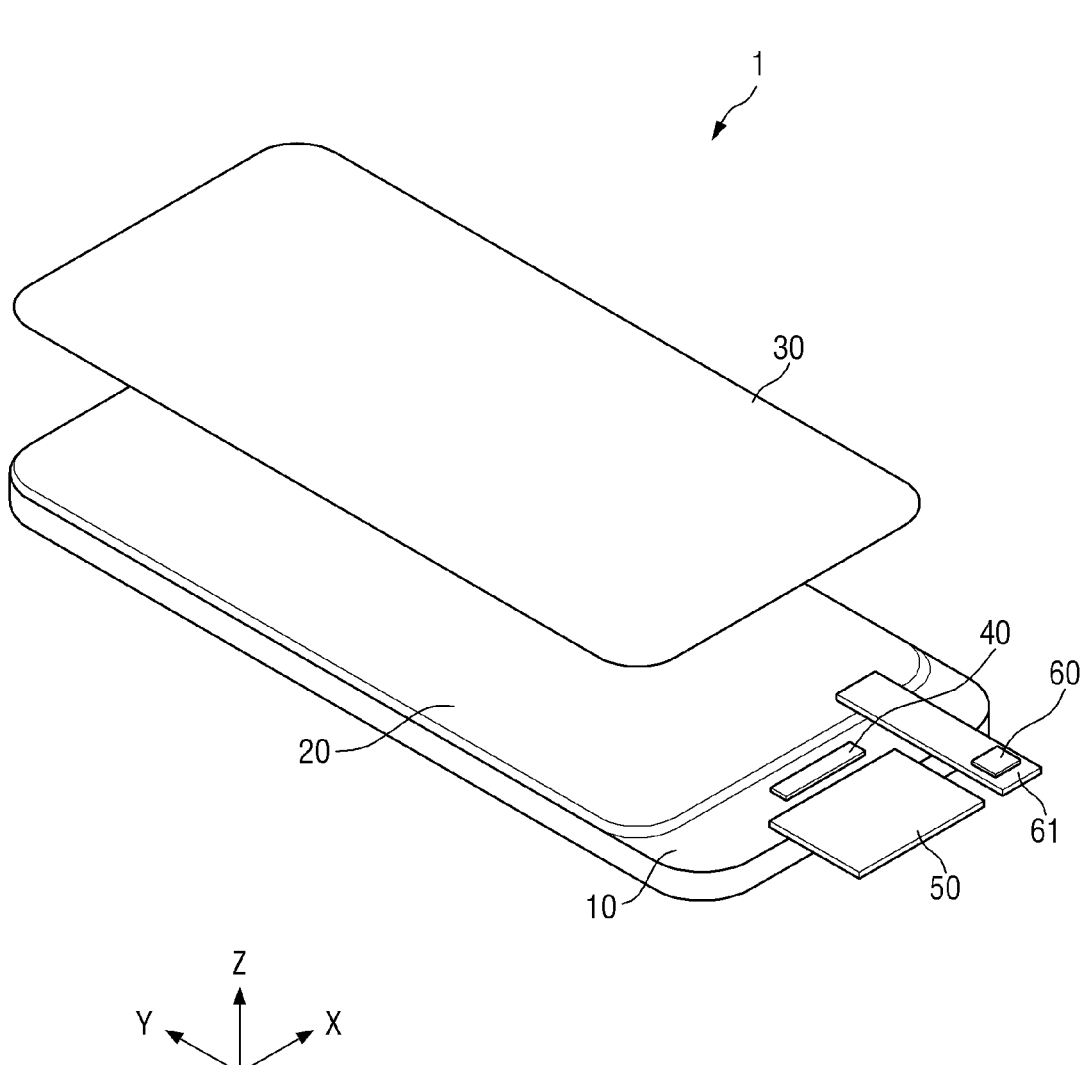
FIG. 1 is a perspective view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. In the accompanying drawings, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there may be no intervening elements present. In contrast, when an element is referred to as being "directly on" another element, there are no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items " " " " " ". For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
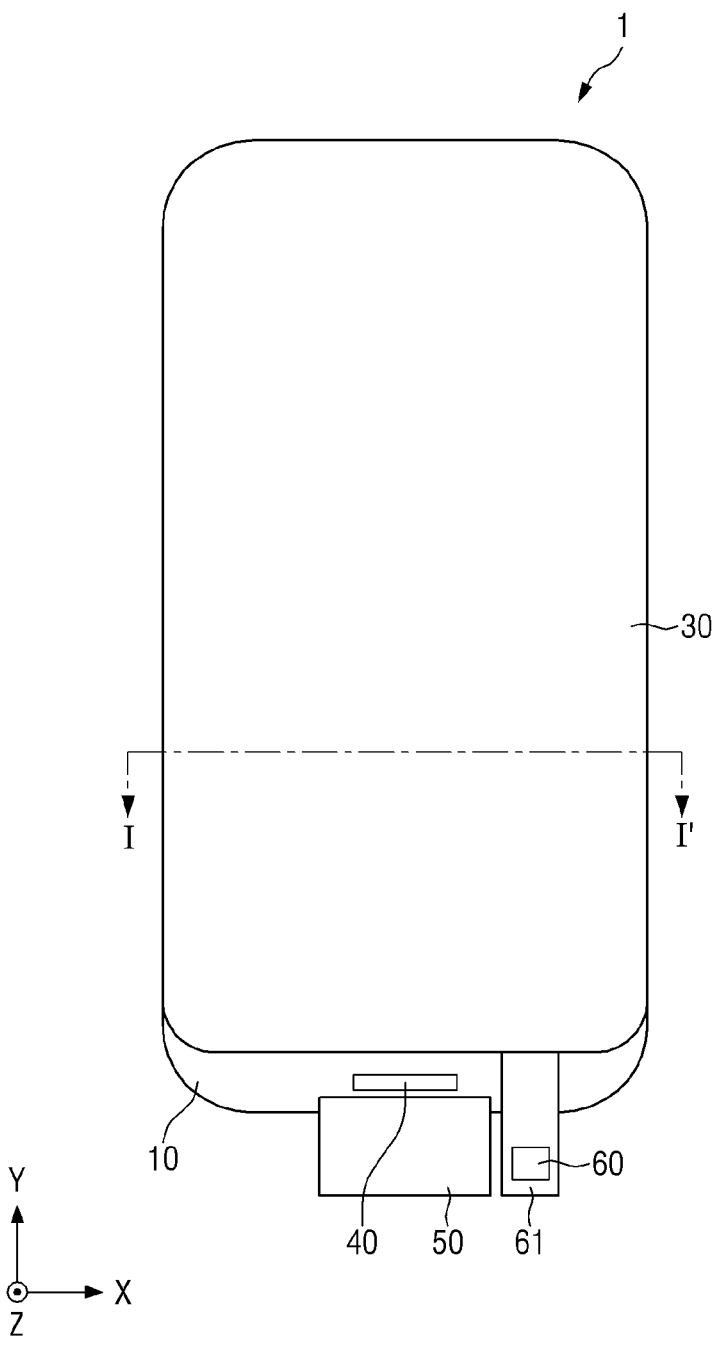
FIG. 2 is a plan view illustrating the display device of FIG. 1.

FIG. 1 is a perspective view illustrating a display device according to an embodiment. FIG. 2 is a plan view illustrating the display device of FIG. 1.

Referring to FIGS. 1 and 2, an embodiment of a display device 1 is a device for displaying a moving image or a still image and may be used as a display screen of various products, such as a television, a notebook computer, monitors, billboards, internet of things (IoT), etc., as well as a portable electronic device such as a mobile phone, a smart phone, a tablet personal computer (PC), an electronic watch (e.g., a smart watch), watch phone, mobile communication terminal, electronic notebook, e-book, portable multimedia player (PMP), navigation, ultra mobile PC (UMPC) and the like.

The display device 1 may be any one selected from an organic light emitting display device, a liquid crystal display device, a plasma display device, a field emission display device, an electrophoretic display device, an electrowetting display device, a quantum dot light emitting display device, and a micro-LED display device. Hereinafter, for convenience of description, embodiments where the display device 1 is an organic light emitting display device will be describe in detail, but the disclosure is not limited thereto.

The display device 1 according to an embodiment includes a display panel 10 that emits light for displaying an image.

The display device 1 may further include a protective substrate (or a protection substrate) 30 disposed on the display panel 10 and configured to protect the display panel 10 from external physical and electrical shocks.

The display device 1 may further include a display driving circuit 40 and a display circuit board 50 for driving the display panel 10.

In an embodiment, the display device 1 may further include a touch sensing unit 20 disposed on the display panel 10 and configured to detect coordinates of a point where a user's touch is performed among a display area in which light for image display is emitted.

In such an embodiment, the display device 1 may further include a touch driving circuit 60 and a touch circuit board 61 for driving the touch sensing unit 20.

The display panel 10 may have a structure including a pair of substrates facing each other and a light emitting element (or layer) or a polarizing element (or layer) disposed between the pair of substrates.

The display panel 10 includes a display area in which the plurality of pixel areas emitting light for image display are arranged, and a non-display area surrounding the display area. The display panel 10 may further include a display electrode pad disposed in the non-display area and electrically connected to the display circuit board 50.

The display area of the display panel 10 may have a rectangular shape having a long side in a first direction (Y-axis direction) and a short side in a second direction (X-axis direction) crossing the first direction (Y-axis direction). However, this is only an example, and the display area of the display panel 10 may be implemented in various forms.

In an embodiment, for example, the display area may have a rounded shape such that a corner where a long side in the first direction (Y-axis direction) meets a short side in the second direction (X-axis direction) has a predetermined curvature. Alternatively, the display area may be in the form of a polygon, a circle, an oval, or the like.

FIGS. 1 and 2 illustrate an embodiment where the display panel 10 has a flat panel shape, the embodiment is not limited thereto. In an alternative embodiment, the display panel 10 includes or is made of a flexible material, and at least a portion thereof may be bent, folded, or rolled. In an embodiment, for example, the display panel 10 may have opposing ends bent in the Y-axis direction.

The touch sensing unit 20 may include touch lines for detecting coordinates of a point touched by the user in the display area, and touch electrode pads disposed in the non-display area and connected to the touch lines.

The touch sensing unit 20 may be formed in a flat shape corresponding to the display area of the display panel 10. Alternatively, the touch sensing unit 20 may be provided in a planar shape different from that of the display panel 10. The flat shape of the touch sensing unit 20 may be a polygon such as a square or a hexagon, a circle, or an oval.

The touch sensing unit 20 may be in the form of a flat plate. Alternatively, the touch sensing unit 20 may have a shape including curved portions disposed at opposing ends in the Y-axis direction. In an embodiment, the touch sensing unit 20 may include or be made of a flexible material, and thus may have the same deformed shape as the display panel 10.

In an embodiment, as shown in FIG. 1, the touch sensing unit 20 may be disposed between the display panel 10 and a protective substrate 30. Alternatively, the touch sensing unit 20 may be embedded in the display panel 10, or the touch sensing unit 20 may be disposed on the protective substrate 30.

The protective substrate 30 may be disposed on the display panel 10 and may be attached to the display panel 10 through an adhesive layer (not shown) covering the touch sensing unit 20.

In an embodiment where the touch sensing unit 20 is embedded in the display panel 10 or disposed on the protective substrate 30, the adhesive layer between the display panel 10 and the protective substrate 30 may be completely adhered to on the upper portion of the display panel 10.

The protective substrate 30 covers at least the display area of the display panel 10 and exposes at least a portion of the non-display area of the display panel 10. In an embodiment, a portion of the display panel 10 including the display electrode pad may not be covered with the protective substrate 30.

The protective substrate 30 may include or be made of a material or thickness having sufficient rigidity to prevent the display device 1 from being easily deformed by an external physical impact.

The protective substrate 30 has insulating properties to protect the display panel 10 from external electric shock and may include or be made of a material having an insulating property and a light-transmitting material to reduce a decrease in light emission efficiency of the display panel 10.

In an embodiment, for example, the protective substrate 30 may include or be made of a glass material including $SiO_2$ as a main component. Alternatively, the protective substrate 30 may include or be made of at least one selected from a plastic material such as polyethersulphone (PES), polyacrylate (PAR), polyetherimide (PEI), polyethylene naphthalate (PEN), polyethylene terephthalate (PET), poly-phenylene sulfide (PPS), polyallylate, polyimide, polycar-bonate (PC), cellulose triacetate (TAC) and cellulose acetate propionate (CAP).

The display driving circuit 40 supplies signals and power for driving the display panel 10.

The display driving circuit 40 may supply a data signal to a data line of the display panel 10. In addition, the display driving circuit 40 may further supply the first driving supply power to the first supply driving power line of the display panel 10. Also, the display driving circuit 40 may supply a scan control signal to a scan driver built in the display panel 10.

The display driving circuit 40 may be provided as or defined by an integrated circuit (IC) chip.

In an embodiment, the display driving circuit 40 may be directly mounted on the display panel 10 by a chip on glass (COG) method, a chip on plastic (COP) method, or an ultrasonic bonding method. In such an embodiment, as shown in FIG. 2, the display driving circuit 40 may be disposed in a non-display area of the display panel 10 that is not covered by the protective substrate 30.

Alternatively, the display driving circuit 40 may be mounted on the display circuit board 50.

The display circuit board 50 may include an anisotropic conductive film. In an embodiment, for example, the display circuit board 50 may be a flexible film such as a flexible printed circuit board, a printed circuit board, or a chip on film.

The display circuit board 50 may be attached to display electrode pads of the display panel 10. Accordingly, lead lines (not shown) of the display circuit board 50 may be electrically connected to the display electrode pads of the display panel 10.

The touch driving circuit 60 may be provided as an IC chip (IC chip).

The touch driving circuit 60 may be mounted on the touch circuit board 61. Since the touch circuit board 61 is electri-cally connected to the touch electrode pads of the touch sensing unit 20, the touch driving circuit 60 may be con-nected to the touch electrodes of the touch sensing unit 20 through the touch circuit board 61 and the touch electrode pads.

The touch driving circuit 60 applies touch driving signals to the touch electrodes of the touch sensing unit 20 and measures capacitance values of the touch electrodes. The touch driving signal may be a signal having a plurality of driving pulses. The touch driving circuit 60 may determine whether a touch is input according to the capacitance values and may calculate coordinates of a point where the touch is input.

The touch circuit board 61 may include the anisotropic conductive film.

As the lead lines of the touch circuit board 61 are attached to the touch electrode pads of the touch sensing unit 20, the lead lines of the touch circuit board 61 may be electrically connected to the touch electrode pads of the touch sensing unit 20. The touch circuit board 61 may be the flexible printed circuit board, the printed circuit board, or the flexible film such as the chip-on film.

Figure 3:
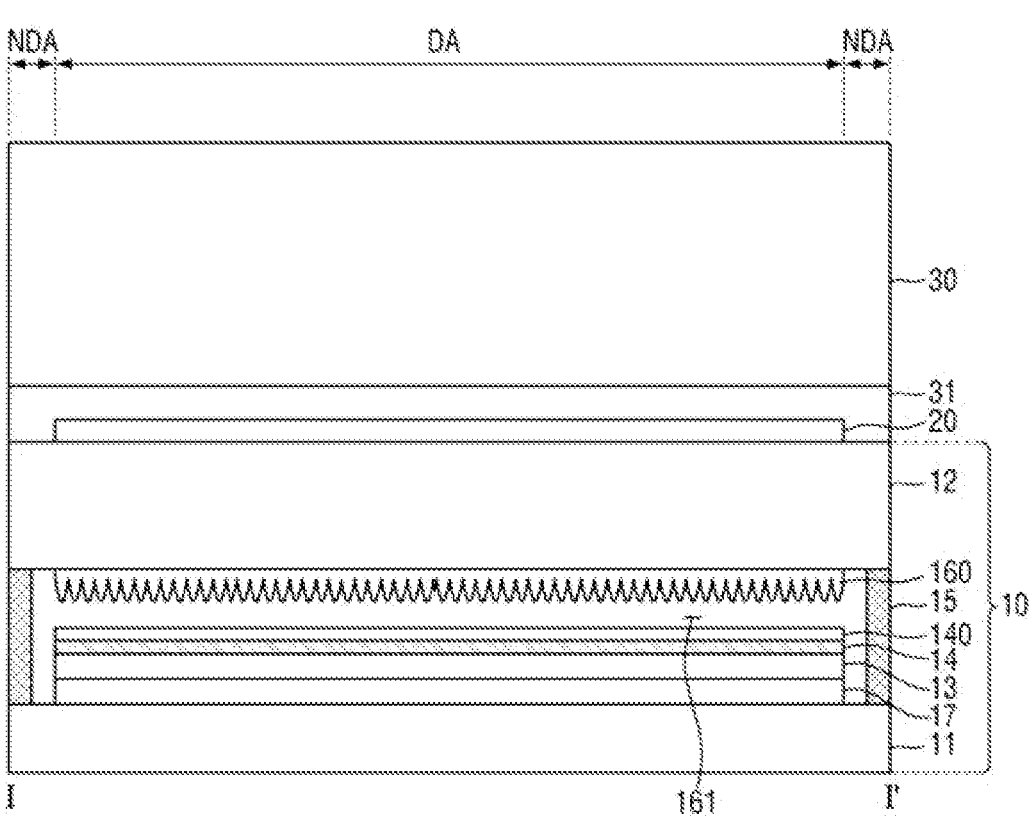
FIG. 3 is a cross-sectional view taken along line I-I' of FIG. 2 according to an embodiment.
Figure 3:
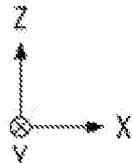

FIG. 3 is a cross-sectional view taken along line I-I' of FIG. 2 according to an embodiment.

The display device 1 includes the display panel 10 that emits light for image display.

Referring to FIG. 3, in an embodiment, the display panel 10 includes a support substrate (or a base substrate) 11 including the display area DA in which the plurality of pixel areas are arranged for displaying an image, and the non-display area NDA around the display area, an encapsulation substrate 12 facing (or disposed opposite to) the support substrate 11, a light emitting array 13 disposed on one surface (e.g., an upper surface) of the support substrate 11 facing the encapsulation substrate 12, a phase adjustment layer 14 disposed on the light emitting array 13, a reflective light absorbing layer (a reflection light absorbing layer or a reflective light absorbing layer) 140 disposed on the phase adjustment layer 14 and which absorbs at least a portion of the light reflected from the light emitting array 13, a sealing layer 15 disposed in the non-display area NDA between the support substrate 11 and the encapsulation substrate 12 and bonding the support substrate 11 and the encapsulation substrate 12, and a reflection adjustment layer (or a reflec-tion control layer) 160 disposed on one surface (e.g., a lower surface) of the encapsulation substrate 12 facing the support substrate 11 and which prevents a portion of light emitted from the light emitting array 13 and emitted to the encap-sulation substrate 12 from being reflected.

The display panel 10 may further include a circuit array 17 disposed on the one surface of the support substrate 11 and including a plurality of pixel driving circuits corre-sponding to the plurality of pixel areas. The light emitting array 13 may be disposed on the circuit array 17.

The support substrate 11 may be provided in the form of a rigid flat plate. Alternatively, the support substrate 11 may be provided in the form of a flexible flat plate that may be easily deformed by bending, folding, or rolling.

The support substrate 11 may include or be made of an insulating material such as glass, quartz, or polymer resin. Here, examples of the polymer resin include polyethersul-phone (PES), polyacrylate (PA), polyarylate (PAR), polyetherimide (PEI), polyethylene naphthalate (PEN), polyethylene terephtalate (PET), polyphenylene sulfide (PPS), polyallylate, polyimide (PI), polycarbonate (PC), cellulose triacetate (TAC), cellulose acetate propionate (CAP), or a combination thereof.

Alternatively, the support substrate 11 may include or be made of the metal material.

The support substrate 11 supports the circuit array 17 and the light emitting array 13 disposed between the support substrate 11 and the encapsulation substrate 12.

The encapsulation substrate 12 may be provided in the form of the rigid flat plate including at least the display area DA. The encapsulation substrate 12 may include or be made of a material having light-transmitting properties and insu-lating properties. In an embodiment, for example, the encap-sulation substrate 12 may include or be made of at least one selected from glass, quartz, and a polymer resin.

The non-display area NDA of the encapsulation substrate 12 may be smaller width than the support substrate 11 to expose the display electrode pad (DP of FIG. 7), etc. disposed in the non-display area NDA of the support sub-strate 11.

The encapsulation substrate 12 is disposed opposite to the support substrate 11 and bonded to the support substrate 11, and the light emitting array 13 is disposed between the support substrate 11 and the encapsulation substrate 12 bonded to each other with the sealing layer 15, etc.

The encapsulation substrate 12 may be provided to be thicker than the support substrate 11 to provide rigidity for maintaining the shape of the display panel 10. In an embodiment, for example, the encapsulation substrate 12 may have a thickness of about 200 micrometers (μm) or more.

The sealing layer 15 is disposed between the support substrate 11 and the encapsulation substrate 12, and may have a frame-shaped pattern surrounding the periphery of the display area DA.

The sealing layer 15 may include or be made of an organic material having adhesiveness. In an embodiment, for example, the sealing layer 15 may include or be made of an epoxy-based resin.

In an embodiment, the support substrate 11 and the encapsulation substrate 12 may be bonded to each other by the sealing layer 15, and the space between the support substrate 11 and the encapsulation substrate 12 may be sealed by the sealing layer 15.

The circuit array 17 is disposed on the one surface of the support substrate 11 and includes the plurality of pixel driving circuits corresponding to the plurality of pixel areas PX. Each of the plurality of pixel driving circuits includes at least one transistor.

The light emitting array 13 is disposed on the circuit array 17 and includes a plurality of light emitting elements corresponding to the plurality of pixel areas PX. Each of the plurality of light emitting elements includes a first electrode and a second electrode facing each other, and a light emitting structure disposed between the first electrode and the second electrode.

The circuit array 17 and the light emitting array 13 will be described later in greater detail with reference to FIGS. 7 and 8.

The phase adjustment layer 14 is disposed on the light emitting array 13 and changes the phase of light passing therethrough. That is, the phase of the light passing through the phase adjustment layer 14 is delayed by a phase difference corresponding to the thickness of the phase adjustment layer 14.

In an embodiment, for example, the phase adjustment layer 14 may delay the phase of light by λ/4. In such an embodiment, the light passing through the phase adjustment layer 14 twice has a phase delayed by λ/2. That is, the phase of the light passing through the phase adjustment layer 14 twice is opposite to the phase of the light not passing through the phase adjustment layer 14. In other words, the phase difference between the light passing through the phase adjustment layer 14 twice and the light not passing through the phase adjustment layer 14 is 180°.

In such an embodiment, the phase of the light incident from the outside of the display panel 10 to the light emitting array 13 through the translucent encapsulation substrate 12 (hereinafter referred to as "external light") is λ/4 is delayed. Also, some of the external light having a phase delayed by λ/4 by the phase adjustment layer 14 is reflected by the light emitting array 13. In addition, some of the external light reflected from the light emitting array 13 passes through the phase adjustment layer 14 and becomes reflected light directed to the encapsulation substrate 12.

Since the phase of the reflected light is delayed by λ/4 by the phase adjustment layer 14, the reflected light has a phase delayed by λ/2 compared to the external light. That is, the phase difference between the reflected light and the external light is 180°. Therefore, the reflected light may have a same magnitude (or intensity) as and opposite phase to the external light.

In such an embodiment, destructive interference between reflected light and externally reflected light may be induced in a reflective light absorbing layer 140 disposed on the phase adjustment layer 14. Accordingly, the reflective light absorbing layer 140 may absorb at least a portion of the reflected light.

The reflective light absorbing layer 140 may include or be made of a material having a refractive index of about 1 or more and an absorption coefficient of about 0.5 or more. In addition, the reflective light absorbing layer 140 may include or be made of an inorganic material capable of thermal evaporation for an easy arrangement process. That is, the reflective light absorbing layer 140 may include or be made of an inorganic material having the refractive index of about 1 or more and an absorption coefficient of about 0.5 or more.

In an embodiment, for example, the reflective light absorbing layer 140 may include or be formed of at least one selected from bismuth (Bi) and ytterbium (Yb).

The reflection adjustment layer 160 is disposed on the encapsulation substrate 12 to face the reflective light absorbing layer 140. The reflection adjustment layer 160 absorbs some of the external light. That is, the reflection adjustment layer 160 may absorb light in a wavelength area (wavelength range or band) that is not emitted from the plurality of pixel areas PX included in the display area DA among external light in the visible ray band.

In an embodiment, the reflection adjustment layer 160 may include or be made of an organic material including the dye or the pigment that absorbs light in a specific wavelength area. The reflection adjustment layer 160 may selectively absorb light in the wavelength area that is not emitted from the plurality of pixel areas among external light incident from the outside.

In an embodiment, for example, where each of the plurality of pixel areas PX corresponds to any one of red, green, and blue, the minimum absorption wavelength area of the dye or the pigment included in the organic material constituting the reflection adjustment layer 160 may be the wavelength area that does not correspond to any of red, green, and blue. In an embodiment, for example, the minimum absorption wavelength range of the dye or pigment included in the organic material constituting the reflection adjustment layer 160 may be a wavelength range of about 490 nanometers (nm) to about 505 nm or a wavelength range of about 585 nm to about 600 nm.

Accordingly, in such an embodiment, the ratio of the light in the wavelength area absorbed by the dye or pigment of the reflection adjustment layer 160 among the external light is emitted to the encapsulation substrate 12 is reduced, and thus external light reflection may be reduced. In such an embodiment, light in a wavelength area corresponding to any one of red, green, and blue among external light passes through the reflection adjustment layer 160 together with the light emitted from the light emitting array 13, so that light efficiency and luminance for each color of the display panel 10 may be improved.

In an embodiment, the reflection adjustment layer 160 is formed in a moth-eye structure (or a moth-eye antireflective structure). The moth-eye structure may include periodic nanoscale structures (e.g., parabolic nano-hemispheres) with dimensions smaller than that of visible light as a region of graded refractive index between the ambient medium and the interface. The moth-eye structure continuously changes the curvature from the interface with air to the interface with the substrate by forming cones with fine curvature on the surface. In such an embodiment, it is possible to prevent the reflection of the entire wavelength area of the visible light and the lowest possible reflectance by preventing the interfacial reflection. The moth-eye structure will be described in greater detail with reference to FIGS. 9, 10, 11, 13 and 14.

A vacuum layer 161 is included (or provided) between the reflection adjustment layer 160 and a reflective light absorbing layer 140.

As described above, the display panel 10 according to an embodiment includes the phase adjustment layer 14 and the reflective light absorbing layer 140 disposed on the light emitting array 13, so that destructive interference between the reflected light by the light emitting array 13 and external light may be induced. Accordingly, the rate at which the reflected light is emitted toward the encapsulation substrate 12 may be reduced.

In addition, the display panel 10 according to an embodiment includes the reflection adjustment layer 160 disposed on one surface (or an upper surface) of the encapsulation substrate 12. In such an embodiment, the ratio of the light emitted from the plurality of pixel areas PX and the light having a different wavelength area to the encapsulation substrate 12 of the external light is reduced and an emission ratio of light having a similar wavelength area to that of light emitted from the plurality of pixel areas PX among the external light OL may be increased. Accordingly, the reflection adjustment layer 160 according to an embodiment maintains resonance by the vacuum layer 161 by being formed in or having a moth eye structure. As a result, the light emission efficiency and display quality of the display panel 10 may be substantially improved.

In an embodiment, as shown in FIG. 3, the display device 1 may further include the touch sensing unit 20 disposed on the display panel 10.

The touch sensing unit 20 may be disposed on an opposing surface (e.g., an upper surface) of the encapsulation substrate 12. Alternatively, the touch sensing unit 20 may be embedded in the display panel 10 by being disposed on the one surface (e.g., the lower surface) of the encapsulation substrate 12.

In an embodiment, the display device 1 may further include the protective substrate 30 attached to the display panel 10 through an adhesive layer 31 covering the touch sensing unit 20.

Figure 4:
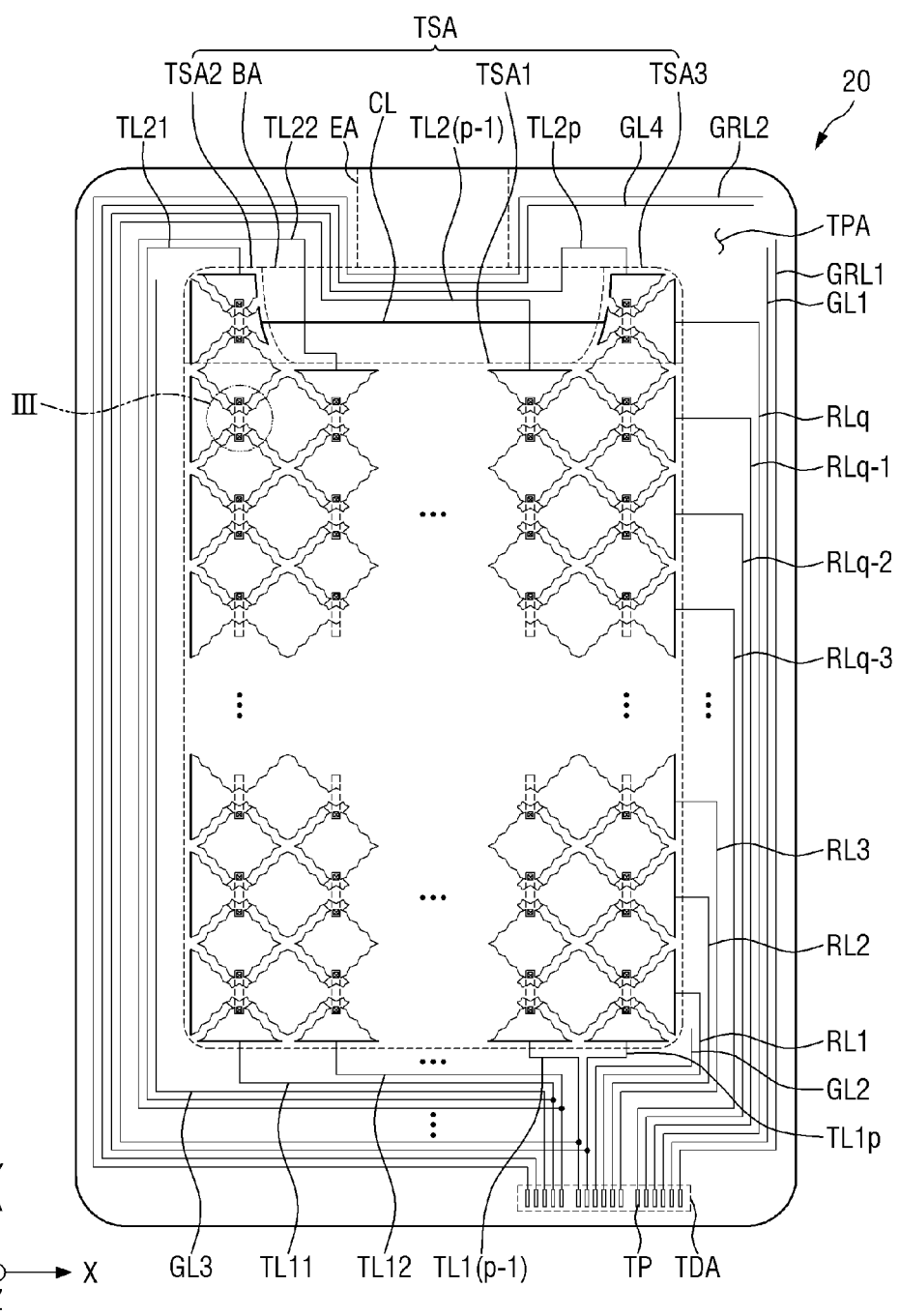
FIG. 4 is a plan view illustrating an embodiment of the touch sensing unit of FIG. 3.
Figure 5:
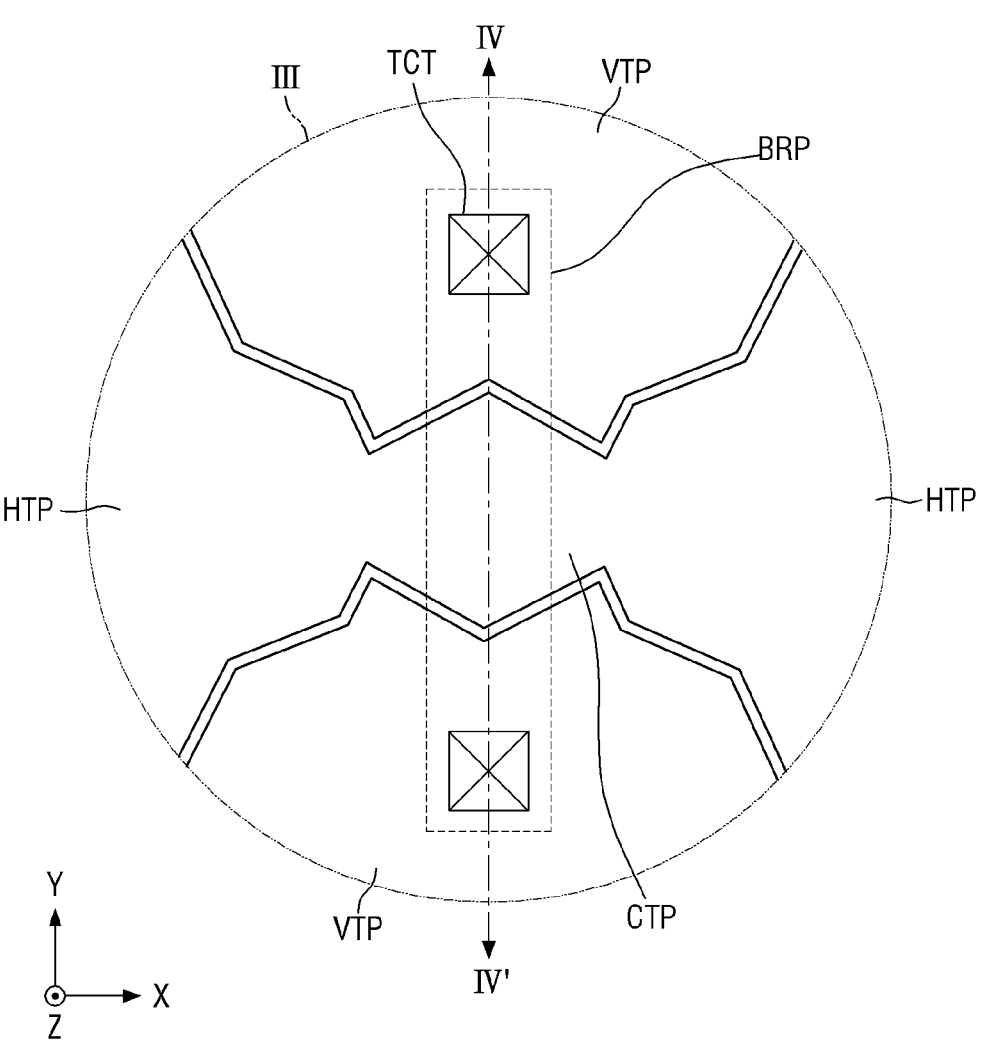
FIG. 5 is an enlarged view showing the encircled portion III of FIG. 4.
Figure 6:
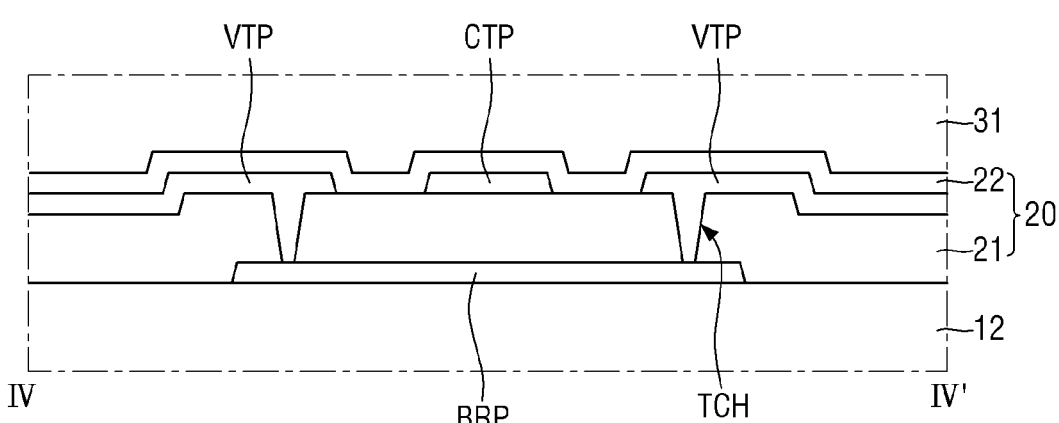
FIG. 6 is a cross-sectional view taken along line IV-IV' of FIG. 5.

FIG. 4 is a plan view illustrating an embodiment of the touch sensing unit of FIG. 3. FIG. 5 is an enlarged view showing the encircled portion III of FIG. 4. FIG. 6 is a cross-sectional view taken along line IV-IV' of FIG. 5.

Referring to FIG. 4, the touch sensing unit 20 includes a touch sensor area TSA for detecting a touch point and a touch peripheral area TPA surrounding the touch sensor area. The touch sensor area TSA may correspond to the display area DA of the display panel 10, and the touch peripheral area TPA may correspond to the non-display area NDA of the display panel 10. In an embodiment, for example, the touch sensor area TSA may overlap the display area DA, and the touch peripheral area TPA may overlap at least a portion of the non-display area NDA.

The touch sensor area TSA may include a rectangular first touch sensor area TSA1, a second touch sensor area TSA2 protruding from one corner of the first touch sensor area TSA1, a third touch sensor area TSA3 protruding from another corner of the first touch sensor area TSA1, and a bay area BA disposed between the second touch sensor area TSA2 and the third touch sensor area TSA3.

The touch sensing unit 20 is disposed in the first touch sensor area TSA1 and the first touch lines TL11, TL12, TL1($p$–1), TL1$p$ (p is a natural number greater than or equal to 4) extending in the first direction (Y-axis direction) and the touch sensor area TSA, and includes second touch lines RL1, RL2, RL3, RLq-3, RLq-2, RLq (q are natural numbers greater than or equal to 7) extending in the second direction (X-axis direction).

The touch sensing unit 20 is disposed in the second touch sensor area TSA2 and the third touch sensor area TSA3 and may further include third touch lines TL21, TL22, TL2($p$–1), and TL2$p$ extending in the first direction (Y-axis direction).

The touch sensing unit 20 may further include a first guard line GL1, a second guard line GL2, a third guard line GL3, and a fourth guard line GL4, a first ground line GRL1, and a second ground line GRL2 disposed in the touch peripheral area TPA.

The first guard line GL1 may be disposed in parallel on the outside of any one RLq that is farthest from the touch sensor area TSA among the second touch lines RL1, RL2, RL3, RLq-3, RLq-2, RLq. Here, the outer side refers to a direction toward a corner adjacent to and parallel to the second touch lines RL1, RL2, RL3, RLq-3, RLq-2 and RLq among the plane-shaped edges of the touch sensing unit 20.

In an embodiment, the first ground line GRL1 may be disposed parallel to the outside of the first guard line GL1.

In such an embodiment, an electrical influence of the first ground line GRL1 on the second touch lines RL1, RL2, RL3, RLq-3, RLq-2 and RLq may be reduced by the first guard line GL1.

In an embodiment, the second guard line GL2 may be disposed between the second touch lines RL1, RL2, RL3, RLq-3, RLq-2, and RLq and the first touch lines TL11, TL12, TL1($p$–1), and TL1$p$.

In such an embodiment, an electrical influence between the second touch lines RL1, RL2, RL3, RLq-3, RLq-2, RLq and the first touch lines TL11, TL12, TL1($p$–1), TL1$p$ may be reduced by the second guard line GL2.

In an embodiment, the third guard line GL3 may be disposed between the first touch lines TL11, TL12, TL1($p$–1), and TL1$p$ and the third touch lines TL21, TL22, TL2($p$–1), and TL2$p$.

In such an embodiment, an electrical influence between the first touch lines TL11, TL12, TL1($p$–1), and TL1$p$ and the third touch lines TL21, TL22, TL2($p$–1), and TL2$p$ may be reduced by the third guard line GL3.

In an embodiment, the fourth guard line GL4 may be disposed between the second touch lines RL1, RL2, RL3, RLq-3, RLq-2, and RLq and the third touch lines TL21, TL22, TL2($p$–1), and TL2$p$.

In such an embodiment, an electrical influence between the second touch lines RL1, RL2, RL3, RLq-3, RLq-2, and RLq and the third touch lines TL21, TL22, TL2($p$–1), TL2$p$ may be reduced by the fourth guard line GL4.

Each of the first touch lines TL11, TL12, TL1($p$–1), and TL1$p$ may include first electrode patterns or a vertical touch electrode pattern (VTP in FIG. 5) arranged in parallel in the first direction (Y-axis direction).

Each of the second touch lines RL1, RL2, RL3, RLq-3, RLq-2, RLq may include second electrode patterns or horizontal touch electrode patterns (HTP in FIG. 5) arranged in parallel in the second direction (X-axis direction).

The third touch lines TL21, TL22, TL2($p$–1), and TL2$p$ are connected to the first electrode patterns VTP disposed in the second touch sensor area TSA2 and the third touch sensor area TSA3.

In an embodiment, the touch sensing unit 20 may further include a connection line CL extending in the second direction (X-axis direction) in the bay area BA. The connection line CL may be connected between the second electrode pattern of the second touch sensor area TSA2 and the second electrode pattern of the third touch sensor area TSA3.

The touch sensing unit 20 may further include the touch electrode pad TP disposed in the touch pad area TDA adjacent to the edge of the touch sensing unit 20 among the touch peripheral areas TPA.

In an embodiment, the touch sensing unit 20 may further include an empty area EA including a portion adjacent to one side of the bay area BA among the touch peripheral areas TPA.

The empty area EA is an area for arranging a sensor device such as a camera built into the display device 1. In an embodiment, where the display device 1 is implemented as a multi-functional smart device such as a mobile phone, a smart phone, or a tablet personal computer, the display device 1 may have a built-in sensor device (not shown) such as a camera device, a proximity sensor device, an illuminance sensor device, and an iris recognition sensor device. In such an embodiment, where the sensor device is disposed in the empty area EA, an increase in a bezel width due to the embedding of the sensor device may be effectively prevented.

Referring to FIG. 6, a bridge pattern BRP formed in a line shape in the first direction is disposed between and to overlap the first touch electrode patterns VTP adjacent in the first direction (Y-axis direction).

In an embodiment, each of the first touch lines (TL11, TL12, TL1(p−1), and TL1p of FIG. 5) includes a first electrode pattern VTP arranged in parallel in the first direction (Y-axis direction) and the bridge pattern BRP connected between the adjacent first electrode patterns VTP in the first direction (Y-axis direction).

A contact pattern CTP formed in a line shape in the second direction (X-axis direction) is disposed between the second electrode patterns HTP adjacent in the second direction (X-axis direction).

That is, each of the second touch lines RL1, RL2, RL3, RLq-3, RLq-2, and RLq includes the second electrode pattern HTP arranged in parallel in the second direction (X-axis direction) and the contact pattern CTP connected between the second electrode patterns HTP adjacent to each other in the second direction (X-axis direction).

The bridge pattern BRP is disposed in a layer different from the first electrode pattern VTP, the second electrode pattern HTP, and the connection pattern CTP and crosses the connection pattern CTP.

Accordingly, the first electrode pattern VTP may be connected to the bridge pattern BRP through a touch contact hole TCH.

That is, referring to FIG. 6, the bridge pattern BRP is disposed on the opposing surface (e.g., the upper surface) of the encapsulation substrate 12, and the first electrode pattern VTP, the second electrode pattern HTP, and the connection pattern CTP may be disposed on an inter-touch insulating layer 21 disposed on the encapsulation substrate 12 to cover the bridge pattern BRP.

In such an embodiment, the first electrode pattern VTP may be connected to the bridge pattern BRP through the touch contact hole TCH defined through the inter-touch insulating layer 21.

In an embodiment, the touch sensing unit 20 may further include a touch protection layer 22 covering the first electrode pattern VTP, the second electrode pattern HTP, and the connection pattern CTP.

However, the cross-section of the touch sensing unit 20 shown in FIG. 6 is only an example, it may be modified into any structure if the bridge pattern BRP may be disposed on a layer different from that of the first electrode pattern VTP, the second electrode pattern HTP, and the connection pattern CTP.

Figure 7:
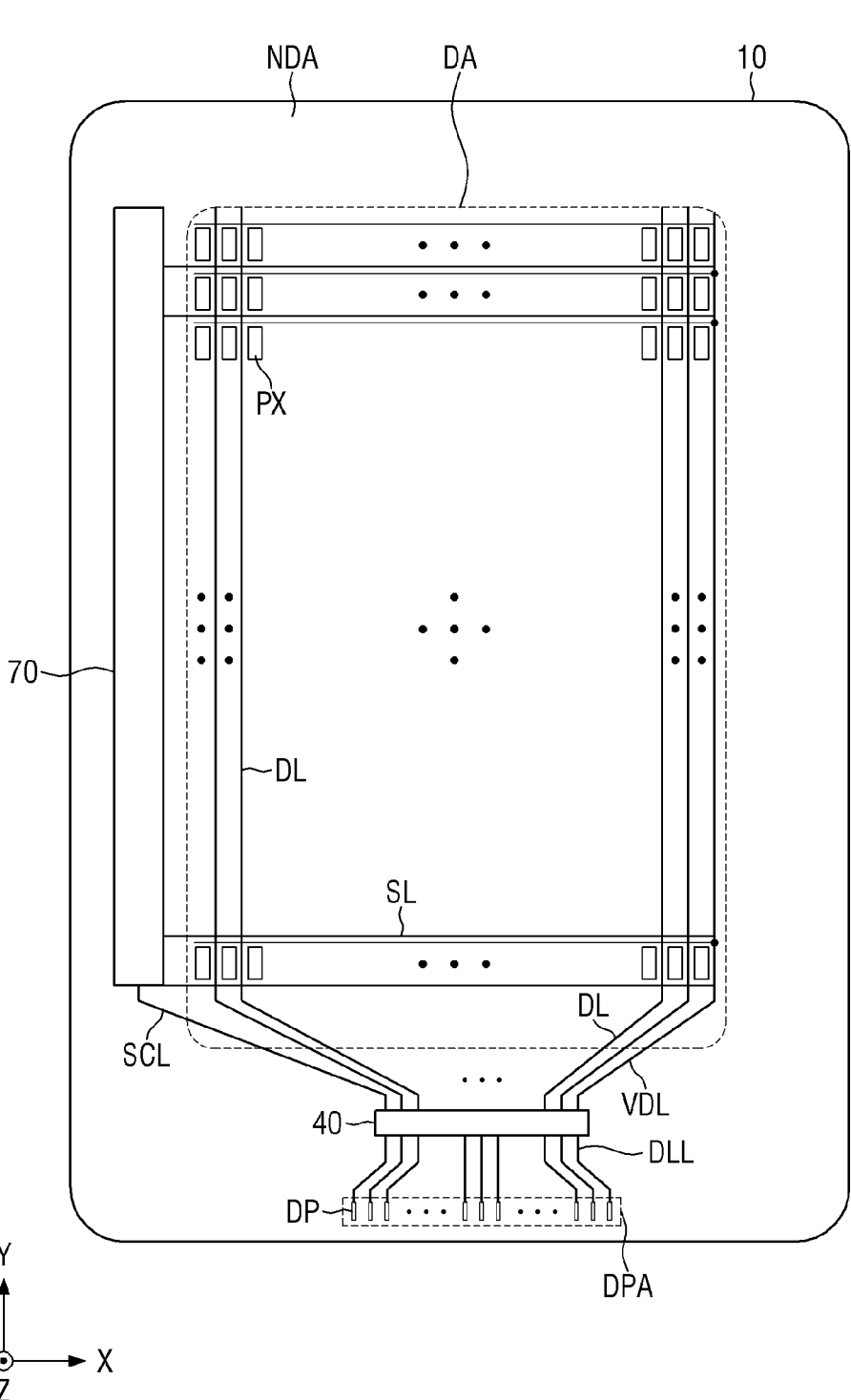
FIG. 7 is a plan view illustrating an embodiment of the display panel of FIG. 3.

FIG. 7 is a plan view illustrating an embodiment of the display panel of FIG. 3. FIG. 8 is an equivalent circuit diagram illustrating an embodiment of a pixel driving circuit corresponding to any one pixel area of FIG. 7.

Referring to FIG. 7, an embodiment of the display panel 10 includes the display area DA that emits light for displaying an image, and the non-display area NDA surrounding the display area DA. The non-display area NDA may include an area from the edge of the display area DA to the edge of the support substrate 11 of FIG. 3.

The display panel 10 includes a plurality of pixel areas PX arranged in a matrix parallel to each other in the first direction (Y-axis direction) and the second direction (X-axis direction) in the display area DA. Each of the plurality of pixel areas PX may be a unit area for individually emitting light with luminance corresponding to a data voltage applied thereto.

The display panel 10 further includes a display electrode pad DP disposed in a display electrode pad area DPA disposed adjacent to the edge of the support substrate 11 in the non-display area NDA.

The display circuit board (50 of FIGS. 1 and 2) may be disposed on the display electrode pad area DPA and may be electrically connected to the display electrode pad DP.

The display panel 10 is disposed in the display area DA and further includes lines for supplying signals or power to the plurality of pixel areas PX. In an embodiment, for example, the display panel 10 may include lines such as a scan line SL, a data line DL, and a first driving power supply line VDL.

The data line DL may be disposed (or extending) in the first direction (Y-axis direction).

The scan line SL may be disposed (or extending) in the second direction (X-axis direction).

The first driving power supply line VDL may be disposed (or extending) in at least one selected from the first direction (Y-axis direction) and the second direction (X-axis direction). In an embodiment, for example, the first driving power supply line VDL may be disposed in the first direction (Y-axis direction) like the data line DL.

The scan line SL supplies a scan signal for selecting pixel areas arranged in parallel in the second direction (X-axis direction) as pixel areas in which data signals are to be written.

The scan line SL may be connected to a scan driving unit 70 disposed in a portion of the non-display area NDA of the display panel 10.

The scan driving unit 70 may receive the scan control signal from the display driving circuit 40 through at least one scan control line SCL.

The scan driving unit 70 may sequentially supply the scan signal to the plurality of scan lines SL arranged in the display area DA during each frame period for image display based on the scan control signal of the scan control line SCL.

Referring to FIG. 7, in an embodiment, the scan driving unit 70 is disposed in a portion of the non-display area NDA adjacent to one side (the left side of FIG. 7) of the display area DA in the second direction. However, this is only an example, and alternatively, the scan driving unit 70 may be disposed in another portion of the non-display area NDA adjacent to the other side (the right side of FIG. 7) of the display area DA. Alternatively, the scan driving unit 70 may be disposed on both opposing sides of the display area DA in the left and right directions.

The data line DL is connected to the pixel areas arranged in parallel in the first direction (Y-axis direction) and supplies the data signal corresponding to the luminance of the pixel area to which the scan signal of the scan line SL is supplied.

The data line DL is connected to the display driving circuit 40, and the display driving circuit 40 may supply the data signal of the pixel area to which the scan signal of the scan line SL is supplied to the data line DL.

The display driving circuit 40 is connected to the display electrode pad DP through a data link line DLL and may receive digital video data and timing signals from the display circuit board 50 connected to the display electrode pad DP.

Figure 8:
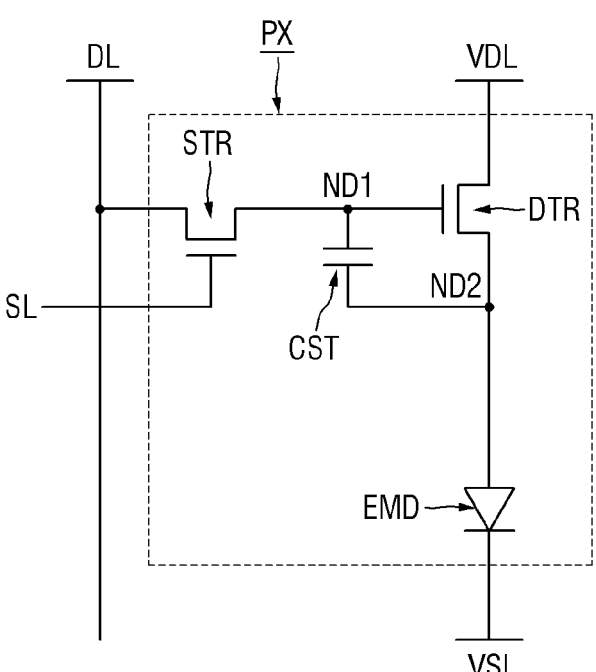
FIG. 8 is an equivalent circuit diagram illustrating an embodiment of a pixel driving circuit corresponding to any one pixel area of FIG. 7.

The first driving power supply line VDL supplies the first driving power for driving the light emitting element EMD (shown in FIG. 8).

The first driving power supply line VDL may receive the first driving power from the display driving circuit 40 or the display circuit board 50.

Each of the plurality of pixel areas PX includes the pixel driving circuit that supplies the driving current to the light emitting element EMD based on the power and signals supplied through lines such as the scan line SL, the data line DL, and the first driving power supply line VDL.

Referring to FIG. 8, each of the plurality of pixel areas PX may include the pixel driving circuit including the light emitting element EMD, a driving transistor DTR, a switching transistor STR, and a storage capacitor CST.

The light emitting element EMD may be an organic light emitting diode including the first electrode and the second electrode facing each other, and a light emitting layer including or made of an organic light emitting material between the first electrode and the second electrode. Alternatively, the light emitting element EMD may include the light emitting layer including or made of an inorganic photoelectric conversion material.

The driving transistor DTR is connected in series with the light emitting element EMD between the first driving power supply line VDL and a second driving power supply line VSL. The second driving power supply line VSL may supply a second driving power having a lower voltage level than a first driving power of the first driving power supply line VDL.

In an embodiment, for example, an anode electrode of the light emitting element EMD may be connected to a drain electrode of the driving transistor DTR, and a cathode electrode of the light emitting element EMD may be connected to the second driving power supply line VSL.

A gate electrode of the driving transistor DTR is connected to the first node ND1 corresponding to the switching transistor STR, and any one of the source electrode and the drain electrode of the driving transistor DTR is connected to the second node ND2 corresponding to the light emitting element EMD, and the other of the source electrode and the drain electrode of the driving transistor DTR may be connected to the first driving power supply line VDL.

The storage capacitor CST is connected between the first node ND1 and the second node ND2. The first node ND1 is a contact point between the gate electrode of the driving transistor DTR and the switching transistor STR. The second node ND2 is a contact point between the driving transistor DTR and the light emitting element EMD.

The switching transistor STR is connected between the data line DL and the first node ND1 and is turned-on based on the scan signal of the scan line SL. That is, the gate electrode of the switching transistor STR may be connected to the scan line SL, one of the source electrodes and the drain electrodes of the switching transistor STR may be connected to the data line DL, and the other of the source electrode and the drain electrode of the switching transistor STR may be connected to the first node ND1.

Accordingly, when the scan signal is supplied to the scan line SL, the switching transistor STR is turned-on based on the scan signal of the scan line SL, and the data signal of the data line DL is transferred to the first node ND1 through the turned-on switching transistor STR.

The driving transistor DTR generates a driving current having a magnitude corresponding to the voltage difference between the first node ND1 and the first driving power supply line VDL. In this case, the light emitting element EMD emits light having a luminance corresponding to the driving current of the driving transistor DTR.

Although FIG. 8 shows an embodiment where a pixel driving circuit has a two transistor-one capacitor (2T1C) structure, this is only an example. That is, the pixel driving circuit of the display panel 10 according to the embodiment is not limited to that illustrated in FIG. 8 and may be variously modified.

FIG. 8 illustrates that the driving transistor DTR and the switching transistor STR are formed of or defined by a N-type metal oxide semiconductor field effect transistor (MOSFET), but this is only an example. Alternatively, at least one transistor included in the pixel driving circuit of the display panel 10 may be a P-type MOSFET.

Figure 9:
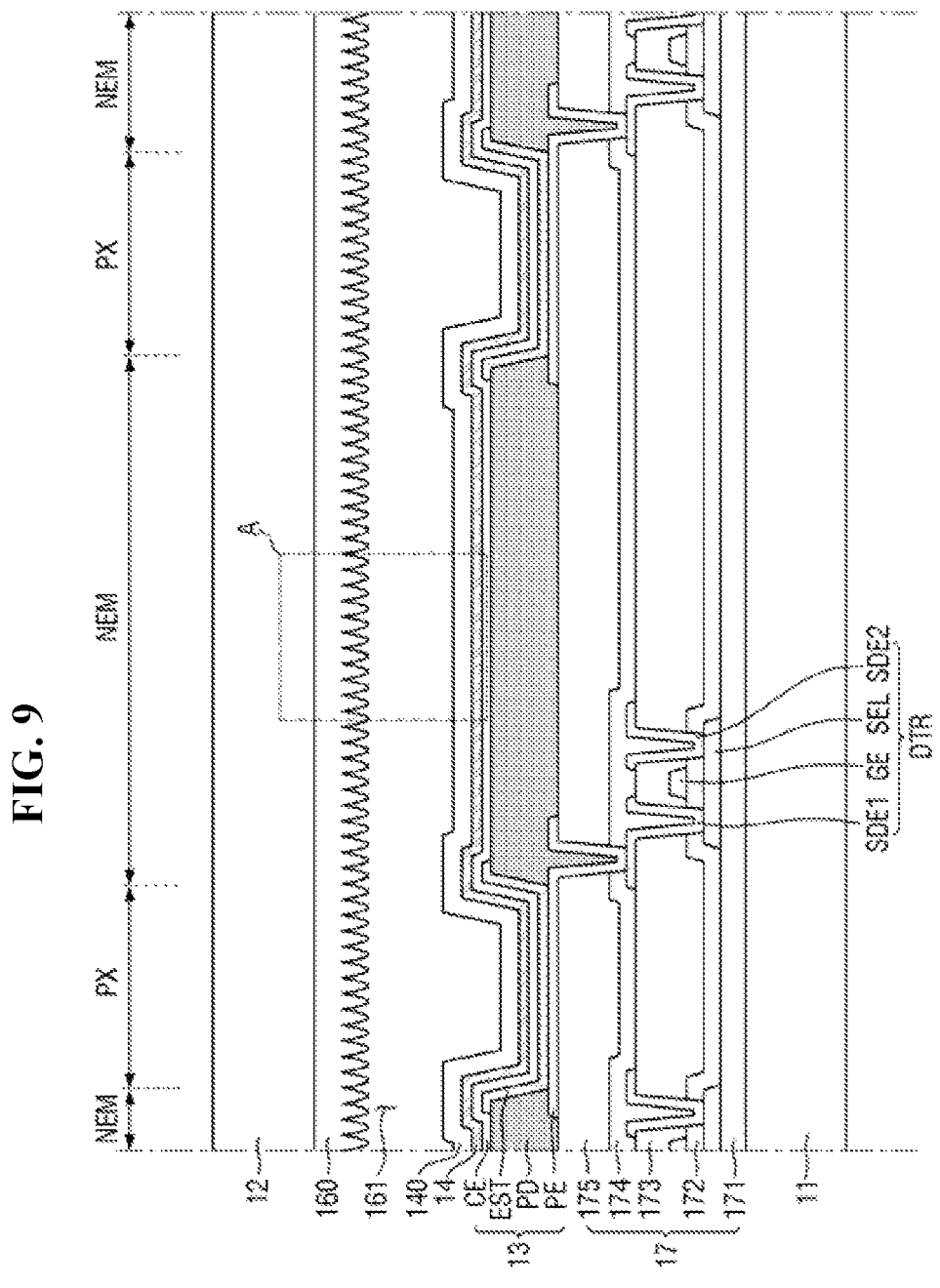
FIG. 9 is a cross-sectional view illustrating an embodiment of a driving transistor and a light emitting element of FIG. 8.
Figure 10:
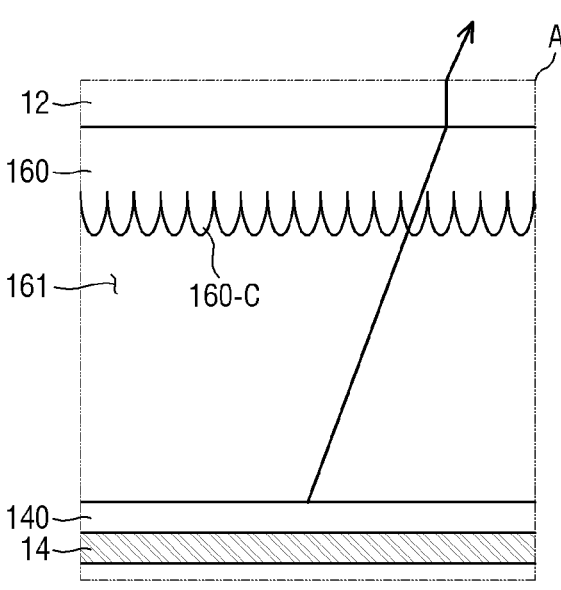
FIG. 10 is an enlarged cross-sectional view of area A of FIG. 9 according to an embodiment.
Figure 11:
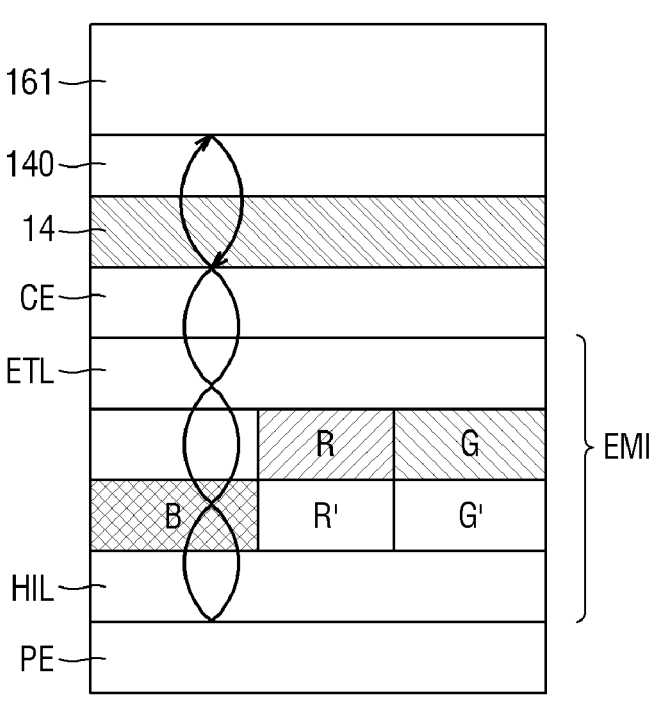
FIG. 11 is an enlarged view of some components of FIG. 9.
Figure 12:
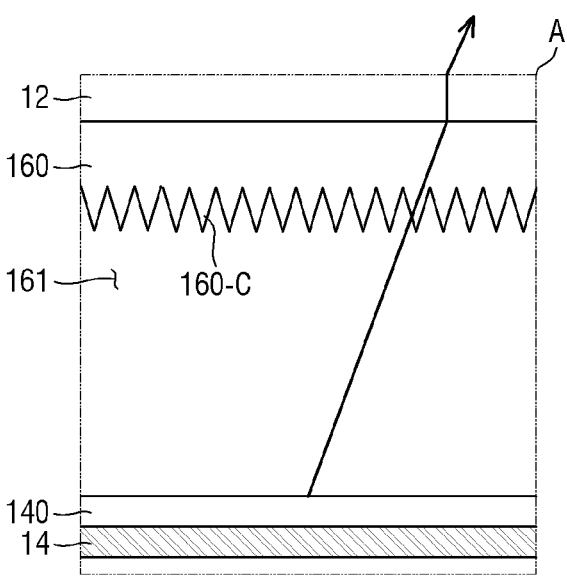
FIG. 12 is an enlarged cross-sectional view of area A of FIG. 9 according to an alternative embodiment.

FIG. 9 is a cross-sectional view illustrating an embodiment of a driving transistor and a light emitting element of FIG. 8. FIG. 10 is an enlarged cross-sectional view of area A of FIG. 9 according to an embodiment. FIG. 11 is an enlarged view of some components of FIG. 9. FIG. 12 is an enlarged cross-sectional view of area A of FIG. 9 according to an alternative embodiment.

Referring to FIGS. 9 and 10, an embodiment of the display panel 10 includes the circuit array 17 disposed on the support substrate 11 and including the pixel driving circuit corresponding to each of the plurality of pixel areas PX, the light emitting array 13 disposed on the circuit array 17 and including a light emitting element corresponding to each of the plurality of pixel areas PX, the phase adjustment layer 14 disposed on the light emitting array 13, and the reflective light absorbing layer 140 disposed on the phase adjustment layer 14.

In an embodiment, for example, the driving transistor DTR provided in each of the pixel driving circuits of the circuit array 17 may include a semiconductor layer SEL disposed on a buffer layer 171 covering one surface of the support substrate 11, a gate electrode GE disposed on a gate insulating layer 172 covering the semiconductor layer SEL and overlapping the channel area of the semiconductor layer SEL, a source electrode (SDE1) disposed on a interlayer insulating layer 173 covering the gate electrode GE and connected to a source region in contact with one side of the channel area of the semiconductor layer SEL, and a drain electrode SDE2 disposed on the interlayer insulating layer 173, spaced apart from a source electrode SDE1, and connected to a drain region in contact with another side of the channel area of the semiconductor layer SEL.

In an embodiment, the driving transistor DTR may further include a light blocking layer (not shown) disposed on the support substrate 11, covered with the buffer layer 171 and overlapping the channel area of the semiconductor layer SEL. In such an embodiment, the light blocking layer may prevent the external light passing through the support substrate 11 from reaching the semiconductor layer SEL, so that the characteristic variation of the semiconductor layer SEL due to the external light may be effectively prevented.

The buffer layer 171 may be entirely disposed on one surface of the support substrate 11. The buffer layer 171 may be formed of or defined by a single layer or multiple layers, each layer including at least one selected from silicon nitride, silicon oxide, and silicon oxynitride.

The semiconductor layer SEL may include or be formed of an oxide semiconductor. The oxide semiconductor may include at least one selected from a binary compound (Abx), a ternary compound (AbxCy), and a quaternary compound (AbxCyDz) including indium (In), zinc (Zn), gallium (Ga), tin (Sn), titanium (Ti), aluminum (Al), hafnium (Hf), zirconium (Zr) and magnesium (Mg) etc.

In such an embodiment, where the semiconductor layer SEL includes or is made of an oxide semiconductor, at least a portion of each of the source region and the drain region of the semiconductor layer SEL may be conductive.

The gate insulating layer 172 may be entirely disposed on the buffer layer 171. Alternatively, the gate insulating layer 172 may be partially disposed only under the gate electrode GE.

The gate insulating layer 172 may include a silicon compound, a metal oxide, or the like. In an embodiment, for example, a gate insulating layer GI may include silicon oxide, silicon nitride, silicon oxynitride, aluminum oxide, tantalum oxide, hafnium oxide, zirconium oxide, titanium oxide, or the like.

The gate electrode GE may include or be formed of a single layer or multiple layers, each layer including at least one selected from silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) and a mixture thereof.

In an embodiment, for example, the gate electrode GE may be a double layer including a lower layer (not shown) disposed on the gate insulating layer 172 and an upper layer (not shown) disposed on the lower layer and including or made of a low-resistance material. In such an embodiment, the lower layer is to prevent the material constituting the upper layer from diffusing into the semiconductor layer SEL and may include or be made of titanium (Ti). In addition, the upper layer may include or be made of copper (Cu) having a relatively low resistance.

The interlayer insulating layer 173 may be entirely disposed on the gate insulating layer 172.

The interlayer insulating layer 173 may include or be formed of an inorganic insulating material such as silicon oxide, silicon nitride, silicon oxynitride, hafnium oxide, aluminum oxide, titanium oxide, tantalum oxide, or zinc oxide.

The source electrode SDE1 is disposed on the interlayer insulating layer 173 and may be connected to a source region of the semiconductor layer SEL through a hole defined through at least the interlayer insulating layer 173.

The drain electrode SDE2 is also disposed on the interlayer insulating layer 173 and may be connected to the drain region of the semiconductor layer SEL through the hole defined through at least the interlayer insulating layer 173.

The source electrode SDE1 and the drain electrode SDE2 may include or be formed of at least one of silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) and a mixture thereof.

The circuit array 17 may further include an auxiliary interlayer insulating layer 174 covering the source electrode SDE1 and the drain electrode SDE2, and a via layer 175 disposed on the auxiliary interlayer insulating layer 174.

The auxiliary interlayer insulating layer 174 may be entirely disposed on the interlayer insulating layer 173. The auxiliary interlayer insulating layer 174 is to prevent separation between the source electrode SDE1 and the drain electrode SDE2 and the via layer 175 and may include or be formed of an inorganic insulating material such as silicon oxide, silicon nitride, silicon oxynitride, hafnium oxide, aluminum oxide, titanium oxide, tantalum oxide, or zinc oxide like the interlayer insulating layer 173.

The via layer 175 may be entirely disposed on the auxiliary interlayer insulating layer 174.

The via layer 175 may have a thickness sufficient (e.g., greater than a predetermined thickness) to remove the step difference of the circuit array 17 and to remove undesired electrical interference between the circuit array 17 and the light emitting array 13.

The via layer 175 may include an organic insulating material such as polyacrylates resin, epoxy resin, phenolic resin, polyamides resin, polyimides rein, and unsaturated polyester resin, poly phenylenethers resin, polyphenylenesulfides resin, or benzocyclobutene (BCB).

The via layer 175 may further include a photosensitive material.

The light emitting array 13 may be disposed on the via layer 175.

The light emitting array 13 may include a plurality of first electrodes PE corresponding to the plurality of pixel areas PX, a pixel defining layer PD corresponding to a non-emission area NEM and covering the edges of each of the plurality of first electrodes PE, a plurality of light emitting structures EST respectively disposed on the plurality of first electrodes PE, and a second electrode CE disposed on the pixel defining layer PD and the plurality of light emitting structures EST.

In an embodiment, each of the plurality of light emitting elements EMD (shown in FIG. 8) corresponding to the plurality of pixel areas PX has a structure in which each of the plurality of light emitting structures EST is interposed between each of the plurality of first electrodes PE and the second electrode CE. That is, the light emitting element EMD may be provided in a structure in which a light emitting structure EST is interposed between a first electrode PE and the second electrode CE.

The first electrode PE is provided as a pixel electrode respectively corresponding to the plurality of pixel areas PX. The first electrode PE may be an anode electrode of the light emitting element EMD.

The first electrode PE may include a first conductive layer including or made of a reflective material.

In addition, the first electrode PE is disposed under the light emitting structure EST and may further include a second conductive layer including or made of a material having a high work function in consideration of the electrical characteristics between the first electrode PE and the light emitting structure EST.

Here, the first conductive layer may include or be formed of a reflective material including at least one selected from silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) and a mixture thereof.

In addition, materials having a high work function corresponding to the second conductive layer may include at least one selected from indium-tin-oxide (ITO), indium-zinc-oxide (IZO), and zinc oxide (ZnO), and indium oxide (In$_2$O$_3$).

In an embodiment, for example, the first electrode PE may have a multi-layer structure of ITO/Mg, ITO/MgF, ITO/Ag, or ITO/Ag/ITO.

The pixel defining layer PD may be an insulating layer disposed entirely on the via layer 175, and in which a hole corresponding to a central portion of each of the plurality of first electrodes PE is defined.

The pixel defining layer PD may include or be formed of at least one organic insulating material selected from poly-acrylates resin, epoxy resin, phenolic resin, polyamides resin, polyimides rein, unsaturated polyesters resin, poly phenylene ethers resin, polyphenylene sulfide resin and benzocyclobutene (BCB).

Alternatively, the pixel defining layer PD may include or be made of an inorganic insulating material such as silicon oxide, silicon nitride, silicon oxynitride, hafnium oxide, aluminum oxide, titanium oxide, tantalum oxide, or zinc oxide.

The pixel defining layer PD may further include a light absorbing material. In such an embodiment, light reflection by the pixel defining layer PD may be prevented, and thus light emission in the non-emission area NEM may be reduced.

The light emitting structure EST is disposed on each of the plurality of first electrodes PE. The light emitting structure EST may be further disposed on the pixel defining layer PD at the edge and periphery of the first electrode PE.

Referring to FIG. 11, the light emitting structure EST may include or be formed of an organic material. In an embodiment, the light emitting structure EST may include the light emitting layer (not shown) including or made of the organic light emitting material, and a hole transport layer (not shown) and an electron transport layer (not shown) disposed on both surfaces of the light emitting layer.

In an embodiment where the display panel 10 displays a color image, each of the plurality of pixel areas PX may correspond to one of two or more different colors. In an embodiment, for example, the plurality of pixel areas PX may correspond to any one of red, green, and blue.

In such an embodiment, a light emitting layer EMI of the plurality of light emitting structures EST corresponding to the plurality of pixel areas PX may include a dopant material or a host material corresponding to any one of two or more different colors.

In an embodiment, for example, where the plurality of pixel areas PX correspond to any one of red, green, and blue, the light emitting structure EST of the pixel area correspond-ing to red may include a red light emitting layer R including the dopant material corresponding to red, the light emitting structure EST of the pixel area corresponding to green may include a green light emitting layer G including the dopant material corresponding to green, and the light emitting structure EST of the pixel area corresponding to blue may include a blue light emitting layer B including the dopant material corresponding to blue.

A hole injection layer HIL may be disposed between the light emitting layer EMI and the first electrode PE and may include a hole-transporting host material.

An electron transport layer ETL may be disposed between the light emitting layer EMI and the second electrode CE and may include an electron-transport host material.

The light emitting structure EST may further include the hole transport layer (not shown) disposed between the hole injection layer HIL and the first electrode PE or an electron injection layer (not shown) disposed between the electron transport layer ETL and the second electrode CE.

Alternatively, the light emitting structure EST may have a structure in which a plurality of stacks including respective light emitting layers are stacked. In such an embodiment, the light emitting structure EST may further include a charge generating layer (not shown) disposed between the plurality of stacks.

Alternatively, the light emitting structure EST may include or be formed of an inorganic semiconductor.

A fine resonance structure is applied to the light emitting structure EST to effectively emit light generated from the light emitting layer EMI to the outside. When light is repeatedly reflected between the first electrode PE having a reflective function (or property) and the second electrode CE, which is a semi-transmissive layer, light of a specific wavelength suitable for the reflection distance is amplified and light of other wavelengths is canceled. In addition, the amplified light may pass through the second electrode CE, which is a semi-transmissive layer, and may be emitted to the outside.

Referring back to FIGS. 9 and 10, the second electrode CE is provided as a common electrode corresponding to the plurality of pixel areas PX in common. The second electrode CE may be the cathode electrode of the light emitting element EMD.

The second electrode CE may include a third conductive layer including or made of a material having a low work function.

Here, examples of the material having the low work function corresponding to the third conductive layer include Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg, etc.).

The second electrode CE may further include a fourth conductive layer disposed on the third conductive layer and including or made of the transparent conductive oxide.

The phase adjustment layer 14 may be disposed on the second electrode CE. The phase adjustment layer 14 changes the phase of the external light entering the light emitting array 13 and changes the phase of the external light reflected by the light emitting array 13.

In an embodiment, the phase difference by the phase adjustment layer 14 may correspond to the thickness of the phase adjustment layer 14.

In an embodiment, for example, the phase adjustment layer 14 may delay the phase of light by λ/4. In such an embodiment, the light that reaches the light emitting array 13 through the phase adjustment layer 14, is reflected from the light emitting array 13, and passed through the phase adjustment layer 14 again, that is, the light that has passed through the phase adjustment layer 14 twice may exhibit the phase difference of λ/2 compared to the light that does not pass through the phase adjustment layer 14.

That is, the reflected light may have a phase opposite to that of the external light due to the phase adjustment layer 14, and thus destructive interference between the reflected light and the external light may be induced.

The reflective light absorbing layer 140 is disposed on the phase adjustment layer 14. The reflective light absorbing layer 140 may absorb at least a portion of the reflected light based on destructive interference between the external light that has not passed through the phase adjustment layer 14 and the reflected light that has passed through the phase adjustment layer 14 twice.

In addition, some of the external light incident on the reflective light absorbing layer 140 may be absorbed by destructive interference with the reflected light, and another portion may be reflected toward the encapsulation substrate 12.

The reflective light absorbing layer 140 may have the refractive index of about 1 or more, have an absorption coefficient of about 0.5 or more, and may include or be made of an inorganic material that may be thermally deposited. In an embodiment, for example, the reflective light absorbing layer 140 may include or be formed of at least one selected from bismuth (Bi) and ytterbium (Yb).

Referring to FIG. 10, the reflection adjustment layer 160 includes a plurality of protrusions 160-C defining the moth-eye structure. The protrusions 160-C face the reflective light absorbing layer 140, protrude in the reflective light absorbing layer 140 direction, and are spaced apart from each other at uniform intervals. The protrusion 160-C is tapered toward the vacuum layer 161. The cross section of the protrusion 160-C may be U-like shaped, but is not limited thereto, and alternatively, the cross-section of the protrusion 160-C1 may be V-like shaped as shown in FIG. 12.

The reflection adjustment layer 160 has a higher refractive index (for example, the refractive index of about 1.1 to about 2.5) than the vacuum layer 161 having the refractive index of 1, and the tapered protrusion 160-C of the reflection adjustment layer 160 is exposed to the vacuum layer 161 positioned between the reflection adjustment layer 160 and the reflective light absorbing layer 140.

Figure 13:
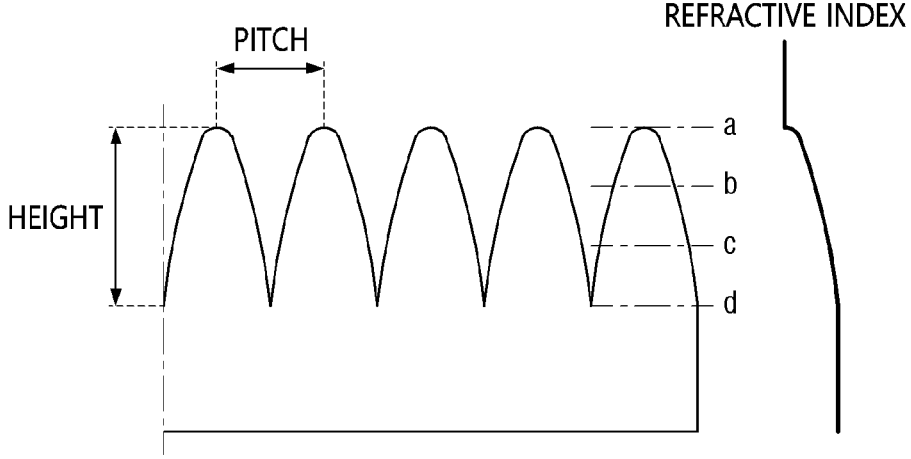
FIG. 13 is a schematic diagram illustrating a change in refractive index in a moth-eye pattern.
Figure 14:
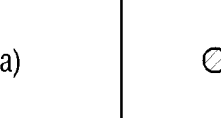
FIG. 14 is a conceptual diagram illustrating a ratio of an air area to a moth eye area at each position of FIG. 13.
Figure 14:
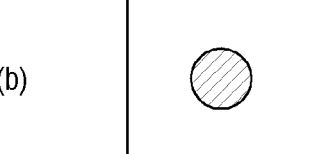
Figure 14:
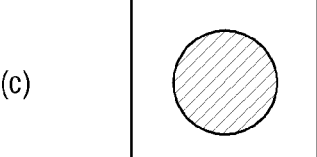
Figure 14:
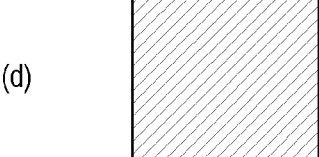

FIG. 13 is a schematic diagram illustrating a change in refractive index in a moth-eye pattern. FIG. 14 is a conceptual diagram illustrating a ratio of an air area to a moth eye area at each position of FIG. 13.

Referring to FIGS. 13 and 14, the protrusion of the moth-eye structure continuously changes the refractive index in the height direction of the protrusion. The area ratio of the air to the protrusion at points a, b, c, and d of FIG. 13 is gradually increased as shown in (a) to (d) of FIG. 14, and the protrusion of the moth-eye structure suppresses the reflectance by smoothing the refractive index change.

The display panel according to an embodiment includes the reflection adjustment layer including or made of a material having the reflection control layer function and formed in the moth-eye structure, so it is possible to improve transmittance, reduce external light reflection, increase light output efficiency, and suppress defects such as Newton ring.

Figure 15:
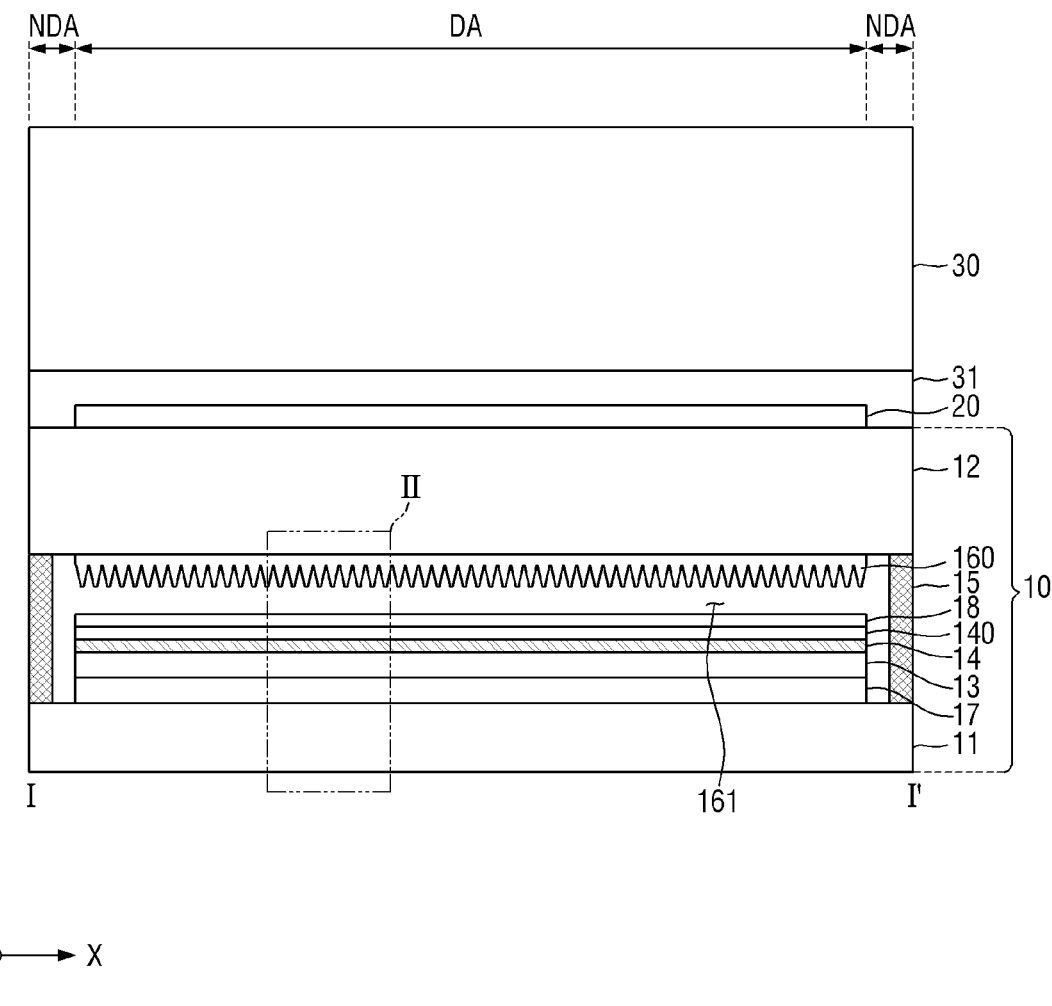
FIG. 15 is a cross-sectional view taken along line I-I' of FIG. 2 according to an alternative embodiment.
Figure 16:
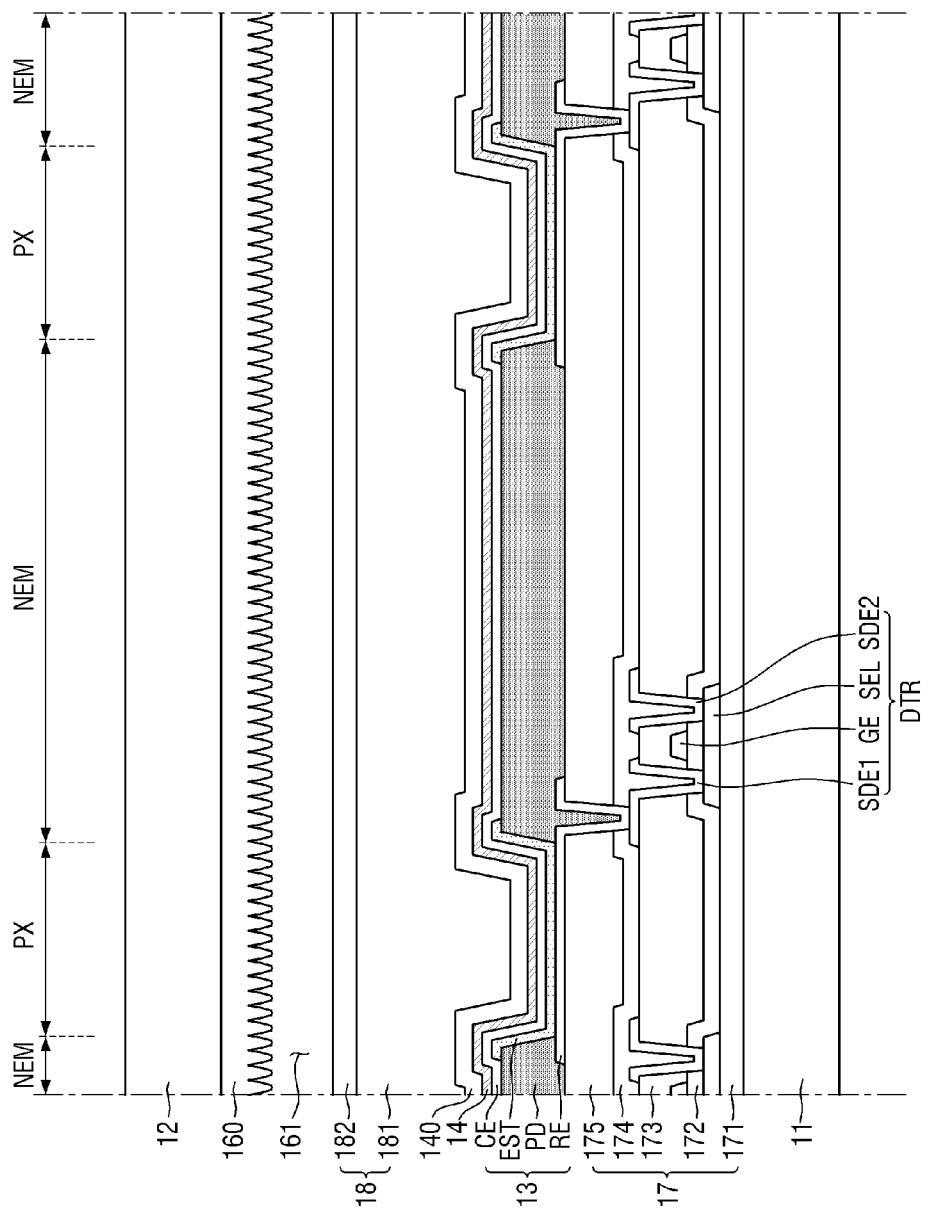
FIG. 16 is an enlarged view showing the encircled portion II of FIG. 15.

FIG. 15 is a cross-sectional view taken along line I-I' of FIG. 2 according to an alternative embodiment. FIG. 16 is an enlarged view showing the encircled portion II of FIG. 15.

The embodiment of the display device shown in FIG. 15 is substantially the same as the embodiments of the display device described above with reference to FIG. 3 except that the display device further includes an encapsulating structure 18. Hereinafter, any repetitive detailed descriptions of the same components as those described above will be simplified or omitted, and differences will be described in detail.

Referring to FIGS. 15 and 16, in an embodiment, the encapsulating structure 18 may be provided to prevent the light emitting layer provided in the light emitting array 13 from being easily and quickly deteriorated by oxygen or moisture.

The encapsulating structure 18 may have a structure in which a plurality of encapsulating layers 181 and 182 including or made of different materials or different thicknesses from each other are stacked one on another.

In an embodiment, as shown in FIG. 16, the encapsulating structure 18 may include a first encapsulating layer 181 including or made of an organic insulating material disposed on the reflective light absorbing layer 140 and a second encapsulating layer 182 including or made of an inorganic insulating material disposed on the first encapsulating layer 181.

In an embodiment, for example, the first encapsulating layer 181 1 may include or be made of at least one selected from an organic insulating material such as polyacrylates resin, epoxy resin, phenolic resin, polyamides resin, polyimides rein, unsaturated polyesters resin, polyphenylene ethers resin, polyphenylenesulfides resin, and benzocyclobutene (BCB).

The second encapsulating layer 182 may include or be formed of at least one inorganic insulating material selected from among silicon nitride, silicon oxide, and silicon oxynitride.

FIG. 16 shows the encapsulating structure 18 having a structure in which the first encapsulating layer 181 and the second encapsulating layer 182 are stacked, but this is only an example. Alternatively, the encapsulating structure 18 may be formed of or defined by a single insulating layer or three or more insulating layers.

Figure 17:
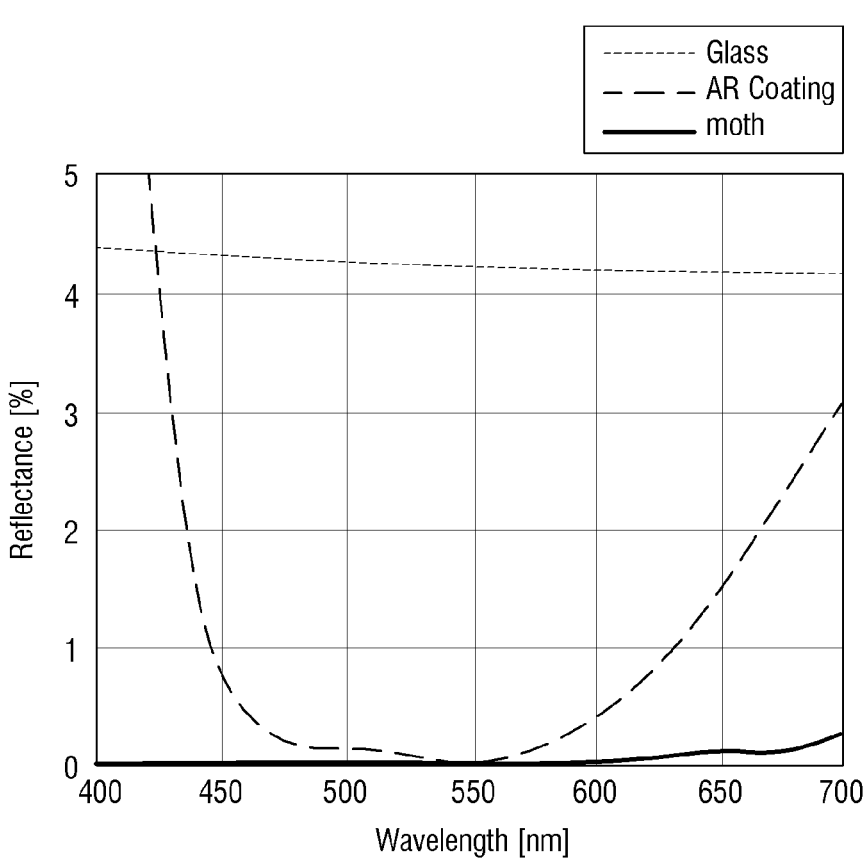
FIG. 17 is a graph showing reflectance of a reflection adjustment layer having a moth-eye structure versus a wavelength according to an embodiment.

FIG. 17 is a graph showing reflectance of a reflection adjustment layer having a moth-eye structure versus a wavelength according to an embodiment.

In FIG. 17, the reflectivity of an anti-reflection layer to which the moth-eye structure according to the embodiment is applied is indicated by a solid line, and the reflectance of a conventional glass and a conventional anti-reflection (AR)-coated glass is indicated by dotted lines. Here, the AR coating means an anti-reflective coating to prevent light reflection or non-intrusion.

The reflectance of the moth-eye structure shows by the solid line shows a reflectance close to zero for light having a wavelength between 100 nm and 700 nm.

However, as shown in FIG. 17, the reflectance of the conventional glass shows a reflectance of more than 4% between 100 nm and 700 nm. In addition, the reflectance of the conventional AR-coated glass shows a reflectance close to zero only at a specific wavelength. The specific wavelength is about 450 nm to 550 nm.

Figure 18:
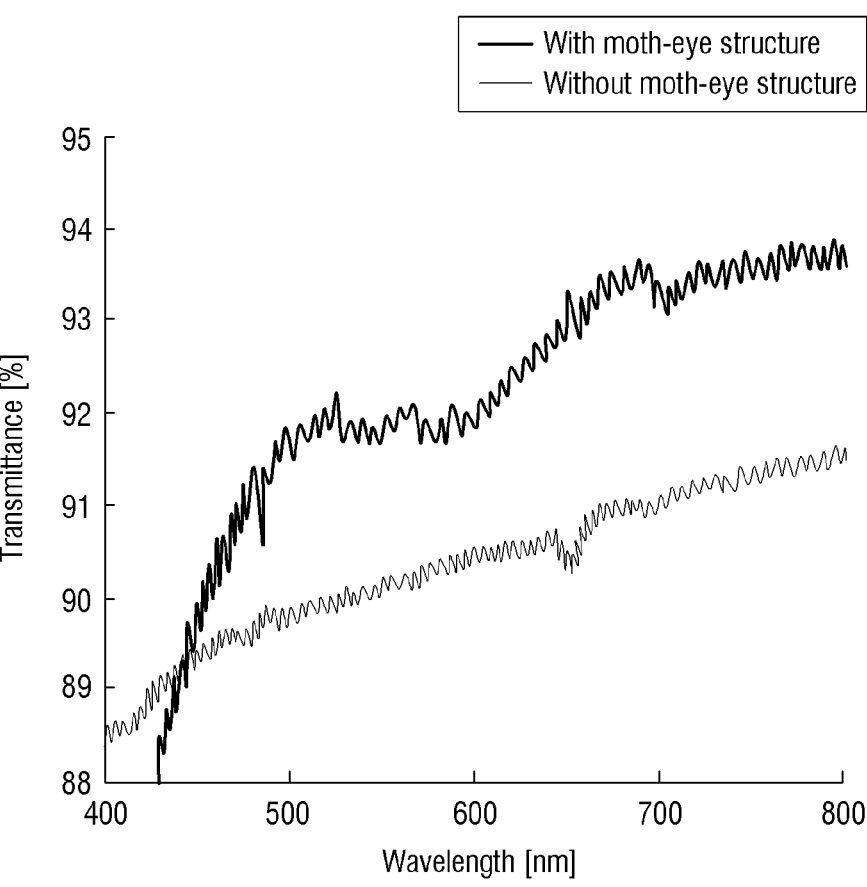
FIG. 18 is a graph showing transmittance of a reflection adjustment layer having a moth-eye structure versus a wavelength according to an embodiment.

FIG. 18 is a graph showing transmittance of a reflection adjustment layer having a moth-eye structure versus a wavelength according to an embodiment.

In FIG. 18, the transmittance of the anti-reflection layer to which the moth-eye structure is applied according to an embodiment is indicated by a thick solid line, and the transmittance of the anti-reflection layer to which the moth-eye structure is not applied is indicated by a thin solid line.

Referring to FIG. 18, it may be seen that the transmittance of the anti-reflection layer to which the moth-eye structure is applied has higher transmittance at a wavelength longer than about 450 nm compared to the case where the moth-eye structure is not applied.

As shown in the graphs of FIGS. 17 and 18, it may be seen that the reflectance may be decreased by 3% or more and the transmittance may be increased by 2% or more in a case where the moth-eye structure is adopted.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising:
   a first substrate including a display area, in which a plurality of pixel areas for displaying an image is arranged, and a non-display area around the display area;
   a second substrate disposed opposite to the first substrate;
   a light emitting array disposed on the first substrate, wherein the light emitting array includes a plurality of light emitting elements corresponding to the plurality of pixel areas;
   a sealing layer disposed in the non-display area between the first substrate and the second substrate, wherein the sealing layer bonds the first substrate and the second substrate to each other;
   a vacuum layer sealed by the sealing layer and defined between the light emitting array and the second substrate; and
   a reflection adjustment layer disposed on the second substrate, wherein the reflection adjustment layer absorbs a portion of external light,
   wherein the reflection adjustment layer includes a plurality of protrusions protruding toward the light emitting array and exposed to the vacuum layer.

2. The display panel of claim 1, wherein the reflection adjustment layer has a refractive index greater than a refractive index of the vacuum layer,
   wherein the refractive index of the reflection adjustment layer corresponding to each of the plurality of protrusions decreases as being away from the second substrate in a direction to the vacuum layer.

3. The display panel of claim 2, wherein each of the plurality of protrusions has a moth-eye shape which is tapered toward the vacuum layer.

4. The display panel of claim 2, wherein the reflection adjustment layer includes an organic material including a dye or a pigment, and
   wherein the dye or the pigment selectively absorbs light in a wavelength range, which is outside a wavelength range of light emitted from the plurality of pixel areas, among the external light.

5. The display panel of claim 4, wherein an absorption wavelength range of the dye or the pigment includes a wavelength range of about 490 nm to about 505 nm or a wavelength range of about 585 nm to about 600 nm.

6. The display panel of claim 1, further comprising:
   a reflective light absorbing layer disposed between the light emitting array and the vacuum layer, wherein the reflective light absorbing layer absorbs at least a portion of light reflected from the light emitting array.

7. The display panel of claim 6, wherein the reflective light absorbing layer includes at least one selected from bismuth (Bi) and ytterbium (Yb).

8. The display panel of claim 7, wherein the reflective light absorbing includes an inorganic material having a refractive index of about 1 or more and an absorption coefficient of about 0.5 or more.

9. The display panel of claim 6, further comprising:
   a phase adjustment layer disposed between the light emitting array and the reflective light absorbing layer, wherein the phase adjustment layer changes a phase of light passing therethrough.

10. The display panel of claim 9, wherein the phase adjustment layer delays the phase by λ/4, wherein the reflective light absorbing layer absorbs at least the portion of the light reflected from the light emitting array based on a face interference between the external light, which is incident from the second substrate, and reflected light, which is incident from the second substrate, passed through the phase adjustment layer, and reflected by the light emitting array.

11. The display panel of claim 9, further comprising:
   an encapsulating structure disposed on the reflective light absorbing layer.

12. The display panel of claim 1, wherein the light emitting array comprises
   a plurality of first electrodes corresponding to the plurality of pixel areas;
   a pixel defining layer defining the pixel area and covering edges of each of the plurality of first electrodes;
   a plurality of light emitting structures respectively disposed on the plurality of first electrodes; and
   a second electrode disposed on the pixel defining layer and the plurality of light emitting structures;
   wherein each of the plurality of light emitting elements has a structure in which a corresponding one of the plurality of light emitting structures is interposed between a corresponding one of the plurality of first electrodes and the second electrode.

13. A display device comprising:
   a display panel including a display area on which an image is displayed;
   a touch sensing unit disposed on the display panel; and
   a protective substrate attached to the display panel through an adhesive layer covering the touch sensing unit;
   wherein the display panel comprises
      a first substrate including the display area, in which a plurality of pixel areas is arranged, and a non-display area around the display area;
      a second substrate disposed opposite to the first substrate;
      a light emitting array disposed on the first substrate, wherein the light emitting array includes a plurality of light emitting elements corresponding to the plurality of pixel areas;
      a sealing layer disposed in the non-display area between the first substrate and the second substrate, wherein the sealing layer bonds the first substrate and the second substrate to each other;
      a vacuum layer sealed by the sealing layer and defined between the light emitting array and the second substrate; and
      a reflection adjustment layer disposed on the second substrate, wherein the reflection adjustment layer absorbs a portion of external light,
      wherein the reflection adjustment layer includes a plurality of protrusions protruding toward the light emitting array and exposed to the vacuum layer.

14. The display device of claim 13, wherein the reflection adjustment layer has a refractive index greater than a refractive index of the vacuum layer,
   wherein the refractive index of the reflection adjustment layer corresponding to each of the plurality of protrusions decreases as being away from the second substrate in a direction to the vacuum layer.

15. The display device of claim 14, wherein each of the plurality of protrusions has a moth-eye shape which is tapered toward the vacuum layer.

16. The display device of claim 14, wherein the reflection adjustment layer includes an organic material including a dye or a pigment, wherein the dye or the pigment selectively absorbs light in a wavelength range, which is outside a wavelength of light emitted from the plurality of pixel areas, among external light, wherein an absorption wavelength range of the dye or pigment includes a wavelength range of about 490 nm to about 505 nm or a wavelength range of about 585 nm to about 600 nm.

17. The display device of claim 13, wherein the display panel further comprises:

a reflective light absorbing layer disposed between the light emitting array and the vacuum layer, wherein the reflective light absorbing layer absorbs at least a portion of light reflected from the light emitting array.

18. The display device of claim 17, wherein the reflective light absorbing layer includes at least one selected from bismuth (Bi) and ytterbium (Yb).

19. The display device of claim 17, wherein the display panel further comprises:

a phase adjustment layer disposed between the light emitting array and the reflective light absorbing layer, wherein the phase adjustment layer changes a phase of light passing therethrough.

20. The display device of claim 19, wherein the display panel further comprises:

an encapsulating structure disposed on the reflective light absorbing layer.

21. The display device of claim 13, wherein the touch sensing unit is disposed on the second substrate, wherein the touch sensing unit includes a plurality of first touch lines extending in a first direction and a plurality of second touch lines extending in a second direction crossing the first direction, wherein each of the plurality of first touch lines includes a plurality of first electrode patterns arranged in the first direction, wherein each of the plurality of second touch lines includes: a plurality of second electrode patterns disposed in a same layer as the first electrode patterns and arranged in the second direction; and a connection pattern, wherein each of the plurality of first touch lines further comprises a bridge pattern disposed in a different layer from the first electrode pattern and the second electrode pattern, intersecting the connection pattern, and connected between adjacent first electrode patterns in the first direction.

\* \* \* \* \*